United States Patent [19]
Oda et al.

[11] Patent Number: 4,714,331
[45] Date of Patent: Dec. 22, 1987

[54] METHOD AND APPARATUS FOR AUTOMATIC FOCUSING

[75] Inventors: Kazuyuki Oda, Kawasaki; Yoshikiyo Yui, Kawasaki; Yoshiharu Kataoka, Kawasaki; Hideo Hata, Yokohama, all of Japan

[73] Assignee: Canon Kabushiki Kaisha, Tokyo, Japan

[21] Appl. No.: 843,392

[22] Filed: Mar. 24, 1986

[30] Foreign Application Priority Data

| Mar. 25, 1985 | [JP] | Japan | 60-058534 |
| Apr. 3, 1985 | [JP] | Japan | 60-069178 |
| May 9, 1985 | [JP] | Japan | 60-096677 |
| May 13, 1985 | [JP] | Japan | 60-099509 |
| May 13, 1985 | [JP] | Japan | 60-099510 |
| May 13, 1985 | [JP] | Japan | 60-099511 |
| Jun. 18, 1985 | [JP] | Japan | 60-130859 |
| Jun. 18, 1985 | [JP] | Japan | 60-130860 |
| Oct. 17, 1985 | [JP] | Japan | 60-230027 |

[51] Int. Cl.⁴ .............................................. G03B 27/34
[52] U.S. Cl. .................................... 353/122; 353/101
[58] Field of Search ............... 353/101, 121, 122; 355/40, 44, 53–56, 63, 77; 33/180 R, 181 R

[56] References Cited

U.S. PATENT DOCUMENTS

| 4,084,903 | 4/1978 | Pircher | 355/53 |
| 4,420,233 | 12/1983 | Nomoto et al. | 353/122 |
| 4,600,282 | 7/1986 | Yamamura | 353/122 |
| 4,601,560 | 7/1986 | Isohata et al. | 353/121 X |
| 4,615,614 | 10/1986 | Sugiyama | 355/55 X |

Primary Examiner—Harry N. Haroian
Attorney, Agent, or Firm—Fitzpatrick, Cella, Harper & Scinto

[57] ABSTRACT

A distance calculating device includes a plurality of distance measuring systems for measuring the distance between a surface of an object and a predetermined plane, a storing element having portions corresponding respectively to the plurality of measuring systems, for storing therein information as to effectiveness/ineffectiveness of each of values detected, as the result of measurement by the plurality of measuring systems, respectively, in accordance with points of measurement on the surface of the object, and an element for calculating the distance between the surface of the object and the predetermined plane by reference to the storing element and by use of only an effective value, of the detected values, in accordance with the points of measurement on the surface of the object.

34 Claims, 23 Drawing Figures

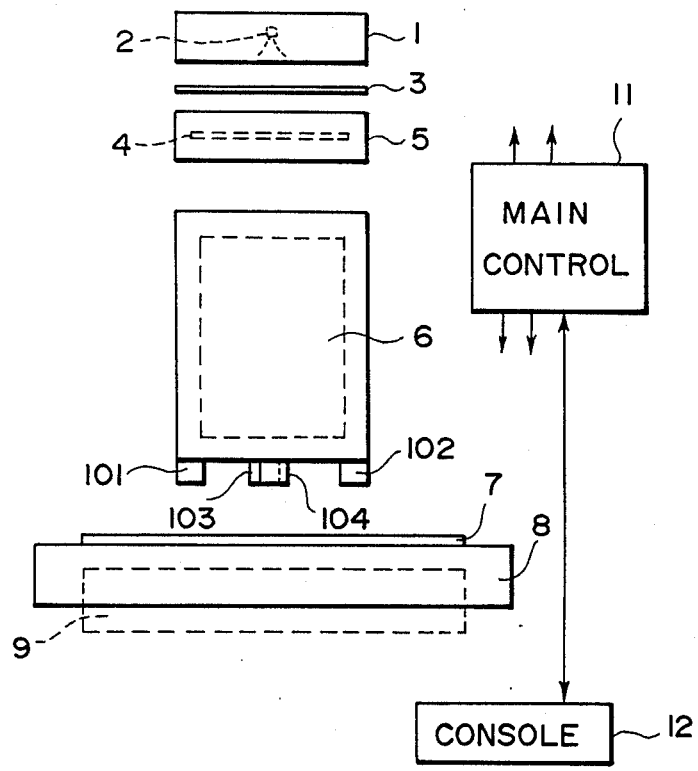
F I G. 1
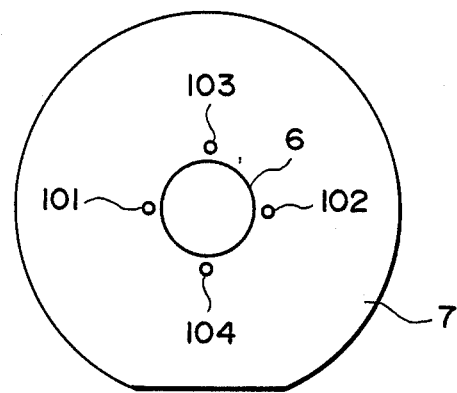
F I G. 2

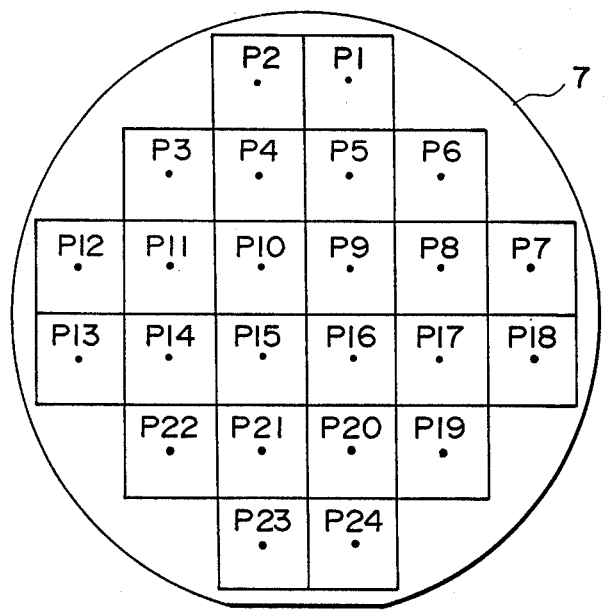
F I G. 3
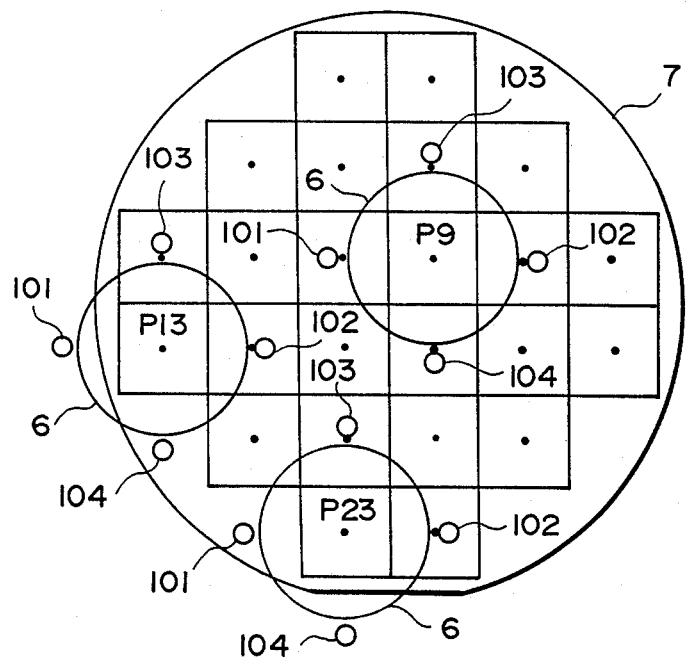
F I G. 4

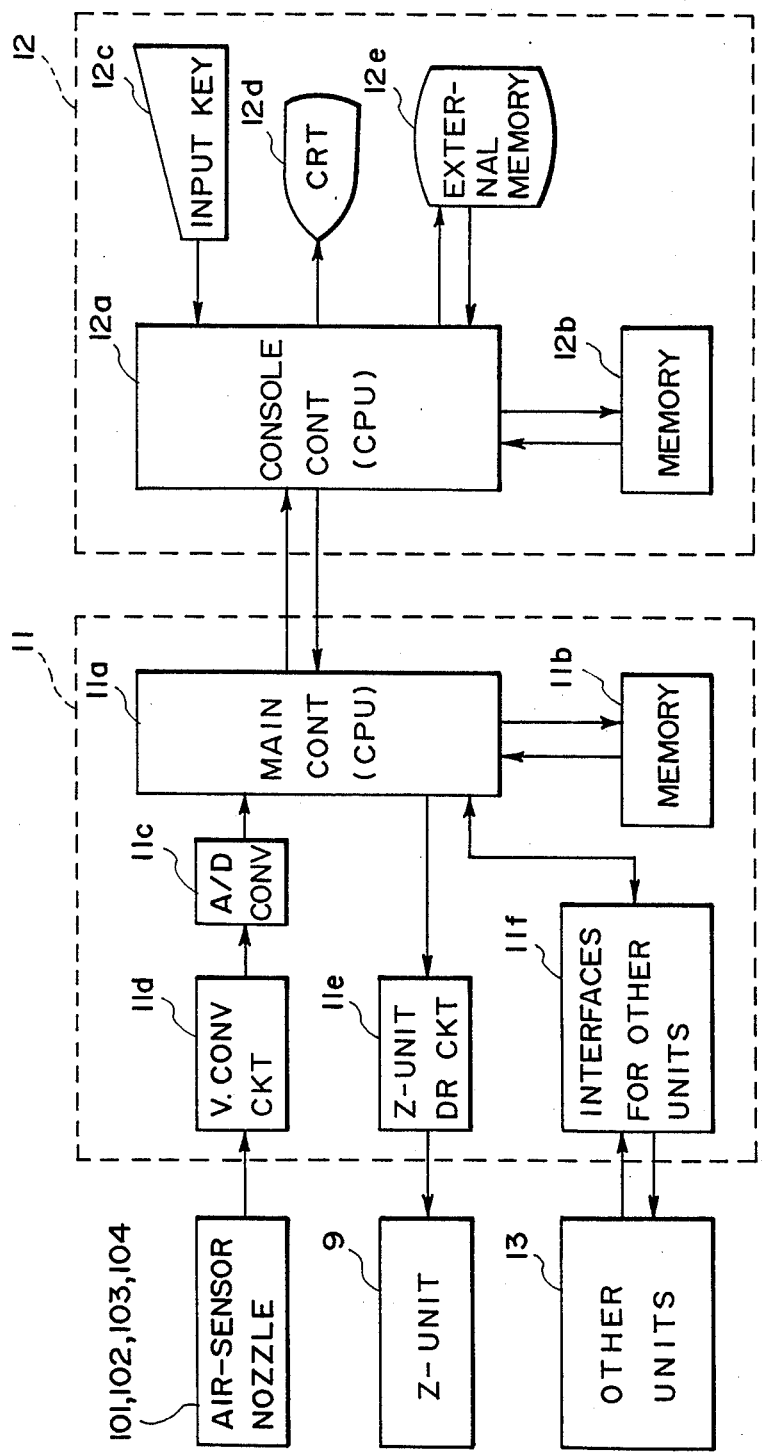
F I G. 5

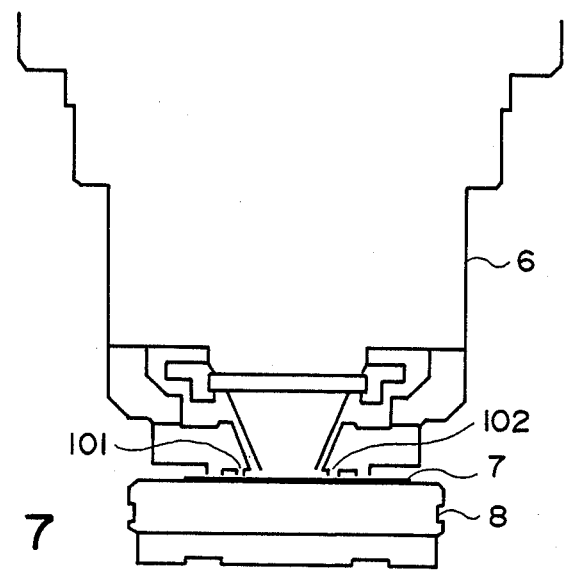
F I G. 7
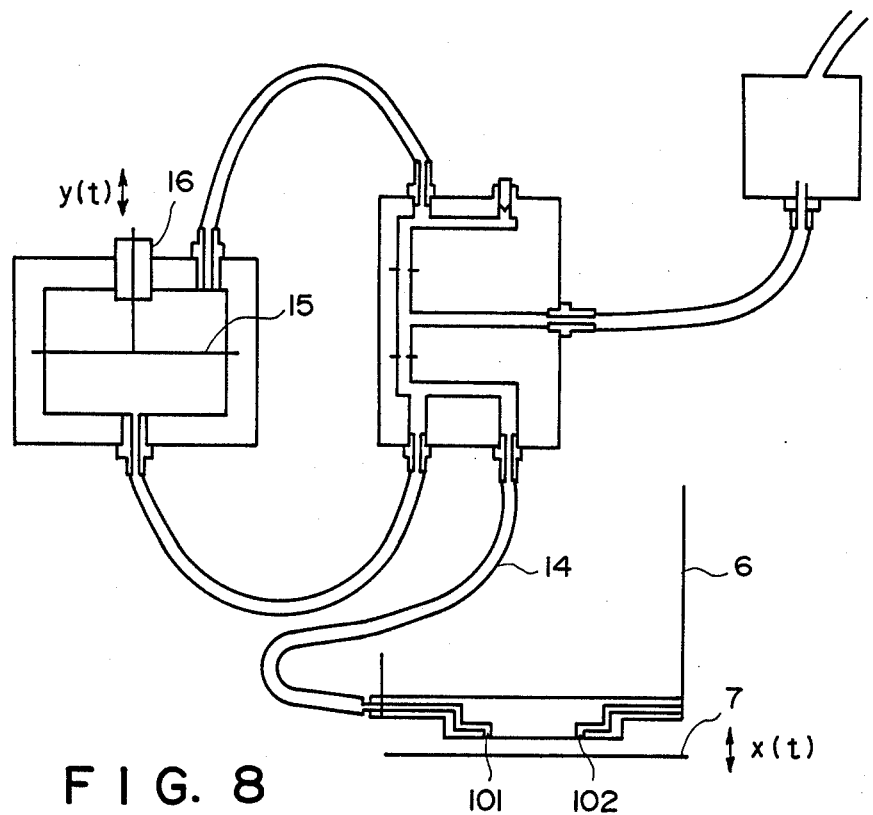
F I G. 8

METHOD AND APPARATUS FOR AUTOMATIC FOCUSING

FIELD OF THE INVENTION AND RELATED ART

This invention relates to a method and apparatus for automatic focusing, suitably usable in a projection type exposure apparatus for use in the manufacture of semiconductor circuit devices such as integrated circuits (ICs), large scaled integrated circuits (LSIs), very large scaled integrated circuits (VLSIs), etc. More particularly, the invention is concerned with a method and apparatus for automatic focusing, effectively usable to precisely locate a surface of an object, being examined, in an imaging plane of a projection optical system or an imaging optical system, adapted to form an image of at least a portion of a photomask or reticle onto a semiconductor wafer, prior to bringing the mask and the wafer into alignment with each other with respect to the imaging optical system.

In the field of semiconductor circuit devices, the minimum width of a line constituting a pattern of the circuit device has been more and more miniaturized. Such tendency has enforced development of projection type semiconductor device manufacturing exposure apparatuses of high resolving power. To attain a high resolving power, a photomask or reticle and a semiconductor wafer used with the exposure apparatus must be accurately positioned in optical reference planes which are optically conjugate with each other with respect to an imaging optical system used in the exposure apparatus.

Many attemps have been made to achieve accurate positioning of the mask and the wafer in such optical reference planes of the imaging optical system. While accurate positioning is attainable to some degree with these attempts, a relatively long time is required for the positioning, with the result that the throughput of the exposure apparatus is decreased significantly. This is disadvantageous.

SUMMARY OF THE INVENTION

It is accordingly a primary object of the present invention to provide a method and apparatus for automatic focusing, suitably usable in a semiconductor device manufacturing exposure apparatus of projection type, by which method and apparatus high-accuracy focusing is stably attainable without decreasing throughput of the exposure apparatus.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view of a reduction projection type exposure apparatus including an automatic focusing device according to an embodiment of the present invention.

FIG. 2 is a plan view showing a positional relation between a reduction projection lens, nozzles of air-microsensors and a wafer, at a certain time.

FIG. 3 is a schematic view showing an example of layout of shot areas on a wafer.

FIG. 4 is a schematic view showing the location of air-microsensors, in three cases, set for the layout of shot areas on the wafer shown in FIG. 3.

FIG. 5 is a block diagram showing a control system used in the FIG. 1 embodiment.

FIG. 7 is an enlarged and schematic view showing a portion of the apparatus of the FIG. 1 embodiment.

FIG. 8 is a schematic view showing the structure of air-microsensors.

DESCRIPTION OF THE PREFERRED EMBODIMENTS

Figure 6:
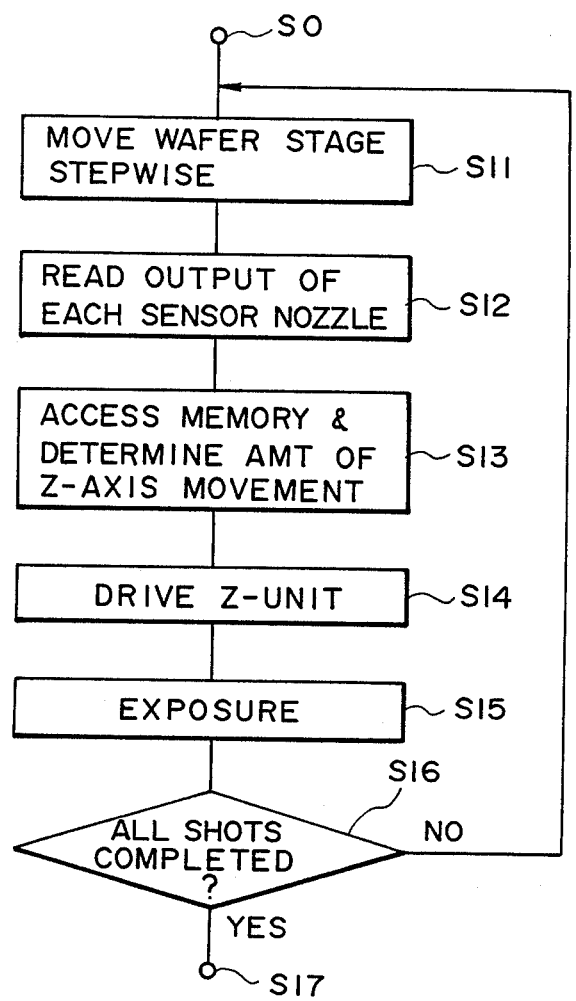
FIG. 6 is a flow chart showing a major portion of the operation of the exposure apparatus of FIG. 1 embodiment.

Referring first to FIG. 1, there is shown a step-and-repeat type reduction projection exposure apparatus for use in the manufacture of semiconductor devices and including an automatic focusing device according to a first embodiment of the present invention.

In FIG. 1, the apparatus includes an illumination optical system 1 for concentrating a reticle illuminating light emitted from a light source 2. A shutter blade 3 is controlled by a main control unit 11 so as to allow transmission of the light from the illumination optical system 1 for a controlled period of time. A reticle 4 is formed with an integrated circuit pattern (not shown) and is held very accurately at a predetermined position by a reticle chuck 5. A projection lens system 6 has a reduced magnification for projecting the pattern of the reticle 4 onto a wafer 7 in a reduced scale. The wafer 7 has a photosensitive or photoresist layer formed on its surface. A wafer stage 8 is provided to hold the wafer 7 for movement in each of an X direction and a Y direction contained in a plane perpendicular to an optical axis of the projection lens 6. A Z-axis drive unit (hereinafter "Z unit") 9 is provided within the interior of the wafer stage 8. The Z unit 9 is adapted to move the wafer 7 in the direction of the optical axis of the projection lens, i.e. in a Z-axis direction. Mounted on a lower portion of the projection lens 6 are four nozzles 101–104 of four air-microsensors which are adapted to detect or measure the distance to the surface of the wafer 7. The main control unit 11 is provided to control various operations, such as the actuation of the shutter blade 3, the actuation of driving units such as the wafer stage 8 and the Z unit 9, or digital processing of response air-pressure from each of air-sensor nozzles 101–104, and the like. Console 12 is provided to input instruction signals into the apparatus to operate the same. The console 12 is electrically connected to the main control unit 11.

FIG. 2 is a plan view of the wafer 7, showing the positional relation between the projection lens 6, air-sensor nozzles 101–104 and the wafer 7 in a certain situation.

Each of the air-microsensors 101–104 is adapted to detect or measure the distance to the wafer 7 surface from a predetermined plane defined with respect to the projection lens system 6. Where the distances detected by the air-microsensors 101–104 are denoted by d1, d2, d3 and d4, respectively, then an average distance between the wafer 7 surface and the predetermined plane of the projection lens system 6 is given by:

$$(d1+d2+d3+d4)/4$$

Where the distance between the above-described predetermined plane of the projection lens system 6 and a predetermined imaging plane of the same projection lens system 6 is denoted by d0, the amount of movement ($\Delta d$) necessary for displacing the wafer 7 surface to the predetermined imaging plane of the projection lens system 6 is given by:

$$\Delta d = d0 - (d1+d2+d3+d4)/4$$

As a result of displacement of the wafer 7 in the direction of the optical axis of the projection lens system 6, i.e. in the Z direction, by the thus detected amount $\Delta d$, the surface of the wafer 7 facing the projection lens system 6 is accurately brought into the predetermined imaging plane of the projection lens system 6.

In FIG. 2 case, the optical axis of the projection lens system 6 is substantially aligned with the center of the wafer 7. So, all of the sensor nozzles 101–104 can detect the distance accurately. Hereinafter, such state of the sensor nozzle will be referred to also as "effective". In semiconductor device manufacturing exposure apparatus of step-and-repeat type, as in the present embodiment, exposure of a semiconductor wafer such as at 7 in FIG. 2 to a pattern of a mask or reticle such as at 4 in FIG. 1 with radiation or light is repeated while moving a wafer stage such as at 8 in FIG. 1, carrying the wafer, in the X direction and/or the Y direction. Therefore, the positional relation between the wafer 7 and the air-sensor nozzles 101–104 shown in FIG. 2 is merely an example in a certain situation.

In other words, it is possible that all the results of detection by the plural distance-measuring means such as air-sensors 101–104 are not "effective" or "correct". As an example, it is possible that one or more of the points of measurement determined by the air-sensors are not on the surface of the object being examined. As another example, it is possible that a protrusion or recess due to the existence of foreign particles or scratches is formed on the surface of the object at position or positions just corresponding to one or more of the points of measurement determined by the air-sensors. In consideration thereof, the following measures may be adopted:

That is, the results of measurement by the plural measuring means are compared with a common reference value or tolerance, and any of these results which is in an extraordinary level as compared with the tolerance is excluded. Then, an average of the results of measurement, excluding the extraordinary one or ones, is calculated and the amount of displacement in the direction of the optical axis is determined by the thus obtained average.

However, the above-described method of determining or setting the amount of displacement in the direction of the optical axis involves following disadvantages:

(1) Each time the measurement is effected at one of the plural measuring points, the result of measurement must be compared with the reference value. This leads to reduction in the amount of disposition per unit time, with the result that the throughput is decreased.

(2) For the occurrence of extraordinary result, it is not possible to discriminate whether such extraordinariness results from irregularity of the surface, from the flatness of the object or from the fact that the point of measurement is not on the surface of the object.

FIG. 3 is a schematic view showing an example of layout of shot areas defined on the wafer 7. In accordance with such layout, the wafer stage 8 is moved stepwise to repeat exposures. More particularly, the shot areas denoted by references P1–P24 are sequentially subjected to the exposure operation, in the named order, while moving the wafer stage 8 in the step-and-repeat manner. Dots shown in respective shot areas P1–P24 in FIG. 3 denote the positions sequentially assumed by the optical axis of the projection lens system 6 as the wafer stage 8 moves stepwise so as to sequentially subject these shot areas to the exposure operation.

FIG. 4 shows the positional relation of the projection lens system 6 and the air-sensor nozzles 101–104 with respect to the surface of the wafer 7. For the shot area P9, all the air-sensor nozzles 101–104 are at positions on the wafer 7 surface, as viewed from the above. Hereinafter, such position of each nozzle relative to the wafer will be referred to also as a "on-wafer position". So, all the air-sensor nozzles 101–104 are effective.

For the shot area P13, however, the air-sensor nozzle 101 is at a position out of the wafer 7 surface and, for the shot area P23, the air-sensor nozzle 104 is at a position out of the wafer 7 surface, both as viewed from the above. Hereinafter, such position of the nozzle relative to the wafer will be referred to also as a "out-of-wafer position". In these cases, effective or correct measurement is not attainable by the air-sensors 101 and 104.

In this manner, the effectiveness/ineffectiveness of the result of measurement by each of the air-microsensor nozzles 101–104 can be determined. Table 1 shows such effectiveness/ineffectiveness of the result of measurement by each air-sensor nozzle with respect to each of the shot areas P1-P24 shown in FIGS. 3 and 4.

TABLE 1

| SHOT NO. | 101 | 102 | 103 | 104 |
|---|---|---|---|---|
| 1 | YES | YES | NO | YES |
| 2 | YES | YES | NO | YES |
| 3 | YES | YES | YES | YES |
| 4 | YES | YES | YES | YES |
| 5 | YES | YES | YES | YES |
| 6 | YES | YES | YES | YES |
| 7 | YES | NO | YES | YES |
| 8 | YES | YES | YES | YES |
| 9 | YES | YES | YES | YES |
| 10 | YES | YES | YES | YES |
| 11 | YES | YES | YES | YES |
| 12 | NO | YES | YES | YES |
| 13 | NO | YES | YES | YES |
| 14 | YES | YES | YES | YES |
| 15 | YES | YES | YES | YES |
| 16 | YES | YES | YES | YES |
| 17 | YES | YES | YES | YES |
| 18 | YES | NO | YES | YES |
| 19 | YES | YES | YES | YES |
| 20 | YES | YES | YES | YES |
| 21 | YES | YES | YES | YES |
| 22 | YES | YES | YES | YES |
| 23 | YES | YES | YES | NO |
| 24 | YES | YES | YES | NO |

In Table 1, numerals 1-24 in the column "shot No." correspond respectively to the shot areas P1-P24 on the wafer 7; "YES" means that the result of measurement by the corresponding air-microsensor upon the exposure for the corresponding shot area can be considered as effective; and "NO" means that such result of measurement can be considered as ineffective.

In the present embodiment, such expected or predicted information as shown in Table 1 is prepared, in advance, by calculation in a central processing unit (CPU) contained in the console 12. And, such expected information is transmitted to the main control unit 11. This is advantageous because it eliminates the necessity of discrimination about whether or not the result of measurement is effective or ineffective, each time one air-microsensor measures the distance to the wafer surface.

FIG. 5 is a block diagram showing a control system of the automatic focusing device according to the present embodiment. In this embodiment, the device is operated in accordance with the instructions supplied from the console 12. First, an operator handles an input key 12c to input, into the exposure apparatus, various data such as the size of the wafer 7, the amount of step-feed movement in each of the X and Y directions, the exposure time, etc. These items of information are transmitted by way of a console controlling central processing unit 12a to a memory 12, so that they are stored therein. The console controlling central processing unit 12a (hereinafter simply "CPU" 12a) effects various calculations on the basis of the information stored in the memory 12b, whereby the coordinates of the centers of the shot areas such as shown in FIG. 3, the effectiveness/ineffectiveness information about the air-microsensors such as shown in Table 1 and the like are obtained. The results of calculation by the CPU 12a are stored again into the memory 12b. When the main assembly of the exposure apparatus is to be started, the operator handles the input key 12c to input a start-instructing code into the apparatus. In response thereto, the information stored in the memory 12b is supplied by way of the CPU 12a to a main assembly controlling central processing unit 11a (hereinafter simply "CPU 11a"). Further, such information is stored into a memory 11b. By this, the main assembly of the exposure apparatus is started. For various units in the main assembly, driving control or signal processing is effected by way of respective interfaces contained in the main control system 11.

The focusing operation for the wafer 7 relative to the projection lens system 6 is effected in the following manner:

First, the response pressures from the air-microsensor nozzles 101-104 are converted by a voltage converting circuit 11d into electric signals. These signals are subjected to an analog-to-digital conversion by an analog-to-digital converter 11c (hereinafter A/D converter), so that they are transformed into digital data. The thus obtained digital data is supplied to the CPU 11a. In this CPU 11a, the results of measurement by the effective air-microsensors, only, are extracted on the basis of the effectiveness/ineffectiveness information concerning the air-microsensors stored in the memory 11b. And, by using the results of measurement which are effective, the amount of necessary displacement or movement in the Z direction is calculated. The result of calculation is supplied to a Z-unit driving circuit 11e. In response thereto, the Z-unit driving circuit 11e is actuated to drive the Z-unit 9 in accordance with the set amount of movement.

FIG. 6 shows a flow chart showing a major portion of the operation of the present embodiment. The flow of an automatic focusing operation will now be described taken in conjunction with the FIG. 6.

At the time of point S0, the coordinates of the centers of the shot areas on the wafer shown in FIG. 3 and the effectiveness/ineffectiveness information about the air-microsensors have already been stored into the memory 11b, and the wafer 7 has already been placed on the wafer stage 8. First, at Step S11, the wafer stage 8 is moved or shifted stepwise so as to bring the first shot area P1 to the exposure station under the projection lens system 6. Upon completion of the wafer stage movement, the outputs of the air-microsensor nozzles 101-104 are read (Step S12). For the purpose of explanation, the results of measurement by the air-microsensor nozzles 101-104, just having been read, are represented by d1, d2, d3 and d4, respectively, in this Specification. Also, the distance between the predetermined imaging plane of the projection lens system 6 and the end face thereof is represented by d0. For the first shot area, the air-microsensor 103 is ineffective (Table 1). This information is obtained by reference to the memory 11b. Therefore, the amount of Z-axis displacement $\Delta d$ for this situation is calculated (Step S13) in accordance with the following equation:

$$\Delta d = d0 - (d1 + d2 + d4)/3$$

Thus, the Z unit 9 is driven by an amount corresponding to $\Delta d$ (Step S14) and exposure of the first shot area P1 is effected (Step S15). Subsequently, the above-described operations from Step S11 to Step S16 are repeated until all the shot areas are processed.

Without the present invention, as described in the foregoing, discrimination may be made at the stage of the Step S13 in FIG. 6, about the effectiveness/ineffectiveness of each of the results of measurement d1, d2, d3 and d4, by comparing these values with a certain reference value. For example, a maximum tolerable value dmax. and a minimum tolerable value dmin. are set for the tolerance of the "effectiveness", and the following discrimination is made: (1) If dmin.<d1<dmax. is satisfied, the measurement is effective; and (2) If dmin.<d1<dmax. is not satisfied, the measurement is ineffective.

Such discrimination is made relative to each of the remaining results of measurement d2-d4. As described, this is time-consuming.

According to the present embodiment, as compared therewith, the time for discrimination can be reduced significantly. The reduction in time becomes more and more noticeable with an increase in the number of wafers, processed, having the same layout of shot areas. That is, the reduction in the processing time is accumulated in the Step S13, which contributes to improvement in the throughput.

In the present embodiment, as shown in FIG. 5, each of the console 12 and the main control system 11 is provided with its own central processing unit (CPU) and a memory. However, the console 12 may be omitted. That is, it is possible to input or store the coordinates of the centers of the shot areas and the information about the effectiveness/ineffectiveness of the air-microsensors, directly into the memory 11b of the main assembly.

Also, the air-microsensors used in the present embodiment as the position detecting means for measuring the distance between the imaging plane of the projection optical system and the surface of the object, may be replaced by such position detecting means that uses the light passed through the projection optical system. Further, the Z-axis movement of the wafer for the sake of automatic focusing may be replaced by up-and-down movement of the projection optical system.

In accordance with the present embodiment, as has hitherto been described, the effectiveness/ineffectiveness of the measurement, to be made, is preparatorily discriminated prior to the initiation of the step-feed or stepwise movement of a planar object such as the wafer, and the amount of movement for the focusing is calculated on the basis of "effective" measurement results only. As a result, when the present embodiment is applied to a semiconductor device manufacturing projection exposure apparatus, the time necessary for automatically focusing a projection optical system relative to a surface of the planar object can be reduced significantly, with the result that the throughput of the apparatus can be increased significantly.

FIG. 7 is a sectional view fragmentarily showing the projection lens system and the air-microsensors of the exposure apparatus of FIG. 1. While two air-sensor nozzles 101 and 102 are shown in FIG. 7, the exposure apparatus is actually provided with four nozzles 101-104 such as shown in FIG. 1.

As is known in the art, for each air-sensor nozzle, shift of the wafer 7 surface toward or away from the air-sensor nozzle causes changes in the pressure or flow rate of an air discharged from the nozzle. Since the air is fluid, such changes in the pressure or flow rate are not immediately sensed by the air-sensor.

FIG. 8 shows the structure of the air-sensor. In FIG. 8, any change in the pressure of the air discharged from the nozzle is transmitted by way of a tube 14 and then by way of a diaphragm 15 to a differential transformer 16, so that a corresponding electric signal is outputted. As the diaphragm 15 is balanced and the flow rate of the air discharged from the nozzle becomes constant, the output voltage from the air-sensor is gradually stabilized or becomes unchanged. As will be described later in detail, the time until the output voltage of the air-sensor becomes stable (hereinafter "stabilization time") is variable, depending on the situation. Conventionally, however, no specific attention has been made to whether or not the output voltage of the air-sensor is stabilized, and a fixed and constant delay time is set. That is, after elapse of such fixed delay time, the output voltage of the air-sensor is read, i.e. the distance is measured. Therefore, depending on the location of the shot area, being examined, it is possible that the timing of measurement is too early. Namely, it is possible that the measurement is effected before the output voltage of the air-sensor becomes stable. This results in unpreferable deterioration of the measurement accuracy.

Figure 9:
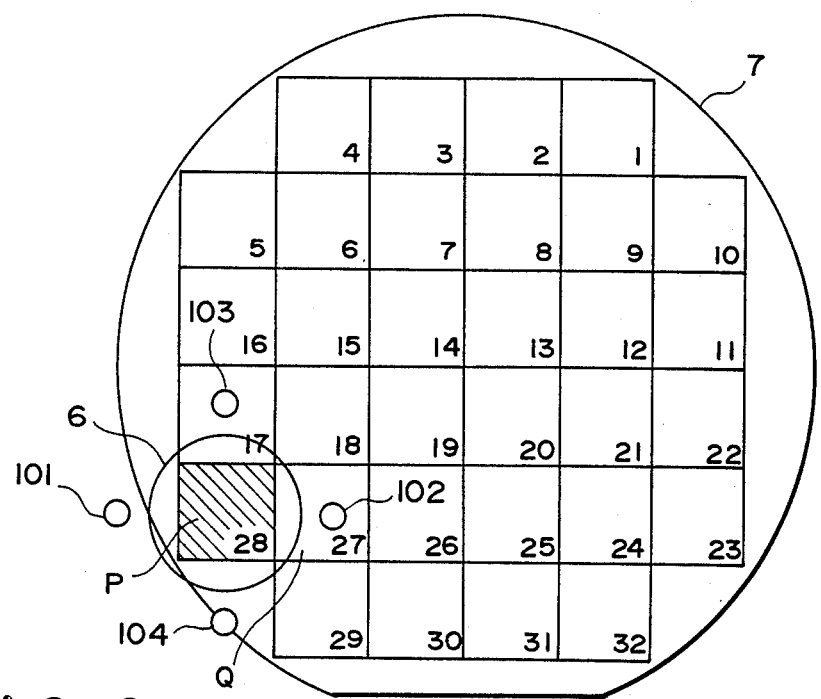
FIG. 9 is a schematic view showing another example of layout of shot areas on a wafer and an example of location of a reduction projection lens and air-microsensors in a certain situation.

FIG. 9 shows another example of layout of shot areas on the wafer and the positional relation between the projection lens 6, the air-microsensor nozzles 101-104 and the wafer 7 in a certain situation. In the layout of FIG. 9, the air-sensor nozzle 101 is ineffective for a shot area P. However, for an adjacent shot area 9, the air-sensor nozzle 101 becomes effective. So, if the wafer 7 is shifted from the illustrated position relative to the projection lens and the air-microsensor nozzles so that the shot area 9 is placed at a position under the projection lens system 6, the measurement by the air-sensor nozzle 101, of the distance to the wafer 7 surface, now becomes possile.

Figure 12:
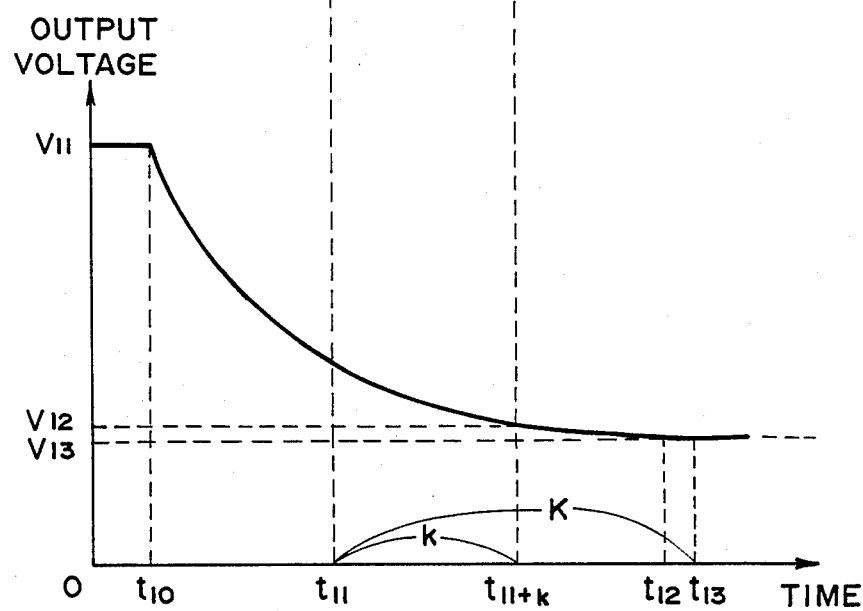
FIG. 12 is a view similar to FIG. 12, but showing the output voltage of the air-sensor where the nozzle of the air-sensor is moved relative to the wafer from an "out-of-wafer position" to an "on-wafer position".

FIG. 12 shows the waveform of the output voltage from the air-microsensor 101 at this occasion, that is, the output voltage of the air-microsensor 101 as the wafer 7 is shifted so that it is opposed to the air-sensor nozzle 101.

In FIG. 12, the stepwise movement of the X-Y stage carrying the wafer 7 is initiated at time 0. The output voltage of the nozzle 101 at that time is V11. The air-sensor starts response at time t10, and the movement of the X-Y stage is completed at time t11. The output voltage of the air-sensor 101 comes close to a stable state at time t12 and becomes substantially stable or constant at time t13. The output voltage of the air-sensor 101, after it is stabilized, is V13. Thus, the time period K until the output voltage of the air-sensor is stabilized after completion of movement of the X-Y stage is given by:

$$K \text{ (sec.)} = t13 - t11$$

Accordingly, correct output voltage V13 is detectable by effecting the measurement at the time of K seconds after completion of movement of the X-Y stage.

Figure 11:
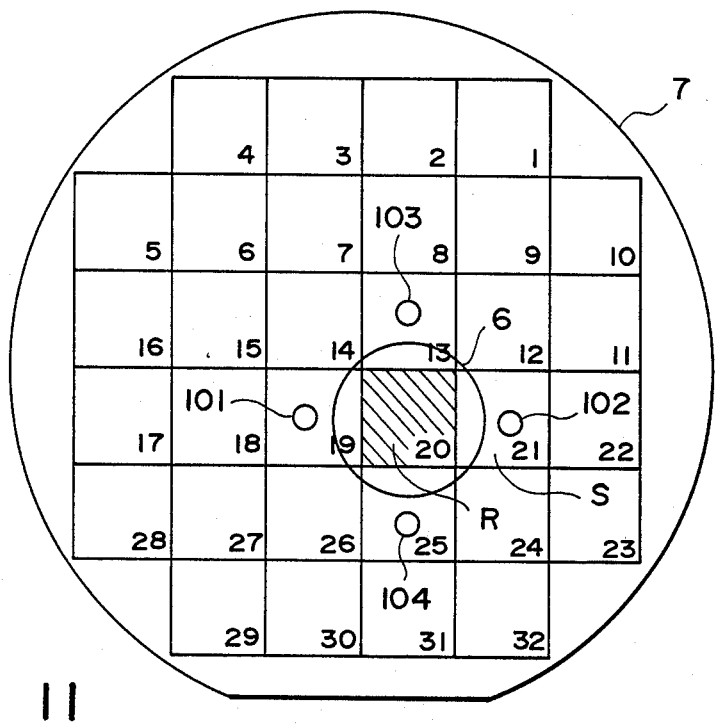
FIG. 11 is a view similar to FIG. 9, but showing location of the reduction projection lens and the air-microsensors in another situation.

Referring now to FIG. 11 showing the same layout of shot areas as that in FIG. 9, when the exposure is to be effected relative to a shot area R, the projection lens system 6 and the air-sensor nozzles 101-104 are so positioned relative to the wafer 7 as illustrated in FIG. 11. Thus, all the air-sensor nozzles 101-104 can detect the wafer surface position, at respective points of measurement. If, after the exposure of the shot area R, the wafer 7 is shifted so that an adjacent shot area S is placed under the projection lens system 6, all the air-sensor nozzles 101-104 are "on-wafer positions". Therefore, the air-sensors 101-104 can detect or measure the distance to the wafer 7 surface.

Figure 10:
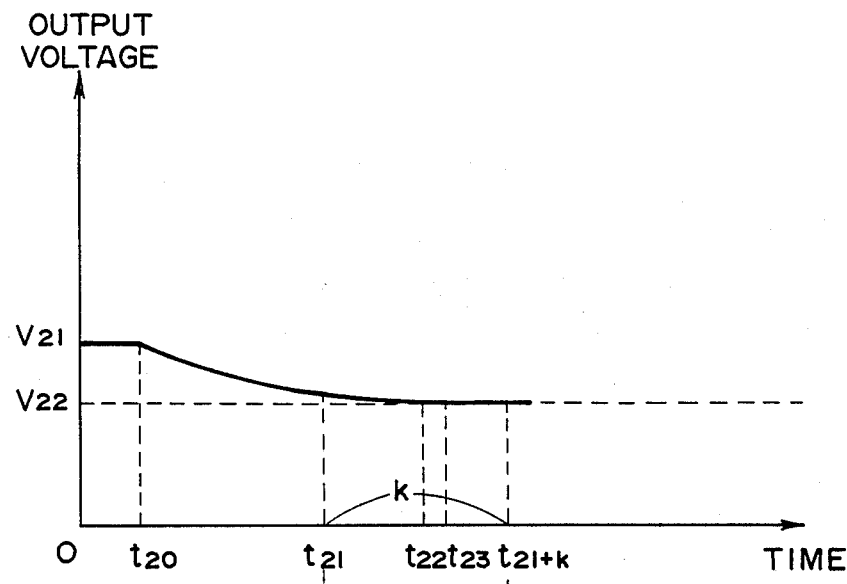
FIG. 10 is a graph showing changes in an output voltage of an air-microsensor, where the nozzle of the air-sensor is shifted relative to a wafer from an "on-wafer position" to anoter "on-wafer position".

FIG. 10 shows the waveform of the output voltage of one of the sensors, obtainable after initiation of the shift of the wafer 7. In FIG. 10, at time 0, the movement of the X-Y stage is initiated. The output voltage of the air-sensor at that time is V21. The air-sensor starts response at time t20, and the movement of the X-Y stage is completed at time t21. Then, the output voltage of the air-sensor comes close to the stable state at time t23 and becomes substantially stable or constant at time t21+k. The output voltage of the air-sensor after it is stabilized is V22. Thus, the time period necessary for the stabilization after completion of movement of the X-Y stage is (t21+k)−t21=k (sec.).

As described in the foregoing, a fixed and constant delay time such as k (sec.) shown in FIGS. 10 and 12 has conventionally been set for the initiation of measurement, regardless of the difference in the stabilization time as depicted in FIGS. 10 and 12. Thus, according to the conventional method, the measurement for the occasion of FIG. 12 is effected at the time k-seconds after the completion of movement of the X-Y stage, i.e. at time t11+k. So, an incorrect voltage V12 is detected, which is deviated from the correct voltage by an amount V12−V13.

It has been found by experiments that the stabilization time is of an order of 0.5–0.6 sec. where a certain air-microsensor is shifted relative to an object, to be examined, from an "out-of-wafer position" to an "on-wafer position", whereas it is of an order of 0.1–0.2 sec. where the air-microsensor is relatively shifted from an "on-wafer position" to another "on-wafer position".

In accordance with a second embodiment of the present invention, as will be described later in detail, the focusing accuracy can be improved significantly while retaining the throughput of an exposure apparatus into which the second embodiment is incorporated.

Important features of the second embodiment of the present invention may be summarized as follows:

(1) By reference to the effectiveness/ineffectiveness information (Table 1) for the air-sensor nozzles with respect to each of the shot areas, which is obtained by calculations in the console, usableness/unusableness of each air-sensor nozzle for each shot area is determined. This determination is made in the manner such as shown in the following Table 2.

TABLE 2

| SHIFT OF NOZZLE POSITION | USABLENESS/ UNUSABLENESS |
|---|---|
| FROM AN "OUT-OF-WAFER POSITION" TO AN "ON-WAFER POSITION" | UNUSABLE |
| FROM AN "ON-WAFER POSITION" TO ANOTHER "ON-WAFER POSITION" | USABLE |

(2) Upon expiration of the fixed and constant delay time of k seconds after completion of the movement of the X-Y stage, the outputs of only the usable air-sensor nozzles are read.

The operation of the present embodiment will now be described in more detail, taken in conjunction with a flow chart of FIG. 13.

First, at Step S21, the "preceding effectiveness/ineffectiveness information" is initialized. In this specification, the words "preceding effectiveness/ineffectiveness information" means the information on the effectiveness/ineffectiveness of the air-microsensor with respect to the preceding or last-processed shot area. For the initial setting at Step S21, in this embodiment, the effectiveness/ineffectiveness information for the first shot area is stored into a working memory as the "preceding effectiveness/ineffectiveness information". Then, the step-and-repeat operation is initiated. That is, first, the X-Y stage starts stepwise movement (Step S22) and, upon completion of the movement, a timer is started (Step S23) so that the system is held in a stand-by state till the end of the delay time of k seconds (Step S24). Next, the effectiveness/ineffectiveness information of the sensor nozzles for the "current" shot area is compared with the preceding effectiveness/ineffectiveness information, and discrimination is made as to whether there is any nozzle newly coming effective (Step S25). That is, whether or not there is any nozzle which has been ineffective for the preceding shot area but which comes effective for the current shot area is discriminated. If there is any one newly coming effective, such nozzle just recovered is not used and the measurement is effected by use of the remaining effective nozzles (Step S27). In other words, the nozzle which has been shifted relative to the wafer from the "out-of-wafer position" to the "on-wafer position" is not used for the sake of measurement. If, on the other hand, there is not any nozzle satisfying the condition of Step S25, the measurement is effected by use of all the effective nozzles (Step S26). Subsequently, the effectiveness/ineffectiveness information of the air-microsensor for the current shot area (hereinafter simply "current effectiveness/ineffectiveness information") is stored into the working memory as the "preceding effectiveness/ineffectiveness information" (Step S28). In addition, the values obtained at Step S26 or S27 are averaged, and the Z-axis focusing movement is effected on the basis of the thus calculated average (Step S29). Then, the exposure for the current shot area is effected (Step S291). If all the shot areas have not yet been processed (Step S292), the sequence goes back to Step S22 so that the wafer stage is moved stepwise to shift the wafer to the next-shot-area exposure position.

The delay time k is a time period necessary for the stabilization of the air-sensor where the nozzle is relatively shifted from an "on-wafer position" to another "on-wafer position". An appropriate value of k can be determined by experiments.

Table 3 shown below is simimilar to Table 1, but shows the effectiveness/ineffectiveness of the air-microsensor nozzles with respect to thirty-two (32) shot areas defined on one wafer. In Table 1, numerals 1–32 in the column "shot No." correspond respectively to the numbers of shot areas 1–32 shown in FIGS. 9 and 11; "YES" means that the result of measurement by the corresponding air-microsensor for the corresponding shot area can be regarded as being correct or "effective"; and "NO" means that such result of measurement can be considered as being incorrect or "ineffective".

Table 4 also shown below shows usableness unsableness of the air-sensor nozzles for each of the shot areas Nos. 1–32, determined in accordance with the present embodiment. In Table 4, "YES" means that the corresponding air-sensor is usable for the sake of measurement with respect to the corresponding shot area; and "NO" means that such air-sensor is unsable. The usableness/unusableness of the air-sensor nozzle is determined by discriminating whether the nozzle is usable or unusable for the sake of measurement at the time of the end of the delay time k after completion of movement of the X-Y stage, the delay time k corresponding to the time necessary for the stabilization of the air-sensor where it is relatively shifted from an "on-wafer position" to anoter "on-wafer position". That is, if accurate measurement is attainable upon expiration of the fixed and constant delay time k, such air-sensor is "usable", whereas if not attainable, such air-sensor is "unusable". As will be understood, the usableness/unusableness information is obtainable, by calculation, from te effectiveness/ineffectiveness information for the air-sensor nozzles shown in Table 3.

TABLE 3

| SHOT NO. | 101 | 102 | 103 | 104 |
|---|---|---|---|---|
| 1 | YES | NO | NO | YES |
| 2 | YES | YES | NO | YES |
| 3 | YES | YES | NO | YES |
| 4 | NO | YES | NO | YES |
| 5 | NO | YES | NO | YES |
| 6 | YES | YES | YES | YES |
| 7 | YES | YES | YES | YES |
| 8 | YES | YES | YES | YES |
| 9 | YES | YES | YES | YES |
| 10 | YES | NO | NO | YES |
| 11 | YES | NO | YES | YES |
| 12 | YES | YES | YES | YES |
| 13 | YES | YES | YES | YES |
| 14 | YES | YES | YES | YES |
| 15 | YES | YES | YES | YES |
| 16 | NO | YES | YES | YES |
| 17 | NO | YES | YES | YES |
| 18 | YES | YES | YES | YES |
| 19 | YES | YES | YES | YES |
| 20 | YES | YES | YES | YES |
| 21 | YES | YES | YES | YES |
| 22 | YES | NO | YES | YES |
| 23 | YES | NO | YES | NO |
| 24 | YES | YES | YES | YES |
| 25 | YES | YES | YES | YES |
| 26 | YES | YES | YES | YES |
| 27 | YES | YES | YES | YES |
| 28 | NO | YES | YES | NO |
| 29 | NO | YES | YES | NO |
| 30 | YES | YES | YES | NO |
| 31 | YES | YES | YES | NO |
| 32 | YES | NO | YES | NO |

TABLE 4

| SHOT NO. | 101 | 102 | 103 | 104 |
|---|---|---|---|---|
| 1 | YES | NO | NO | YES |
| 2 | YES | NO | NO | YES |
| 3 | YES | YES | NO | YES |
| 4 | NO | YES | NO | YES |
| 5 | NO | YES | NO | YES |
| 6 | NO | YES | NO | YES |
| 7 | YES | YES | YES | YES |
| 8 | YES | YES | YES | YES |
| 9 | YES | YES | YES | YES |
| 10 | YES | NO | NO | YES |
| 11 | YES | NO | NO | YES |
| 12 | YES | NO | YES | YES |
| 13 | YES | YES | YES | YES |
| 14 | YES | YES | YES | YES |
| 15 | YES | YES | YES | YES |
| 16 | NO | YES | YES | YES |
| 17 | NO | YES | YES | YES |
| 18 | NO | YES | YES | YES |
| 19 | YES | YES | YES | YES |
| 20 | YES | YES | YES | YES |
| 21 | YES | YES | YES | YES |
| 22 | YES | NO | YES | YES |
| 23 | YES | NO | YES | NO |
| 24 | YES | NO | YES | NO |
| 25 | YES | YES | YES | YES |
| 26 | YES | YES | YES | YES |
| 27 | YES | YES | YES | YES |
| 28 | NO | YES | YES | NO |
| 29 | NO | YES | YES | NO |
| 30 | NO | YES | YES | NO |
| 31 | YES | YES | YES | NO |
| 32 | YES | NO | YES | NO |

Referring now to Tables 3 and 4 and a flow chart of FIG. 13, the flow of sequential process for the first and second shot areas, for example, will be described in more detail.

First, the information, as set forth below, with respect to the first shot area and obtained by reference to Table 3 is stored into the working memory as initial values for the preceding effectiveness/ineffectiveness information (Step S21):

| First shot area |
|---|
| 101 ... Effective |
| 102 ... Ineffective |
| 103 ... Ineffective |
| 104 ... Effective |

Upon completion of movement of the X-Y stage for the first-shot-area exposure position (Step S22), the timer is started (Step S23) so that the system is held in the stand-by stage for the delay time k sec. (Step S24). Subsequently, the effectiveness/ineffectiveness information for the first shot area, such as set forth above, is compared with the stored "preceding effectiveness/ineffectiveness information" (Step S25). Since, for the first shot area, no nozzle newly comes effective, the condition set in Step S25 is not satisfied. Therefore, the sequence proceeds to Step S26, with the result that the measurement is effected by use of two effective air-sensor nozzles 101 and 104 (Step S26). Thereafter, the effectiveness/ineffectiveness information for the air-sensor nozzles with respect to the first shot area, obtainable by reference to Table 3, is stored into the working memory as the preceding effectiveness/ineffectiveness information (Step S28). Subsequently, the Z-axis focusing movement (Step S29) and the exposure (Step S291) are effected in this order. Upon completion of the exposure of the first shot area, the X-Y stage is moved to shift the wafer to the second-shot-area exposure position (Step S22). And, the timer is started (Step S23) to establish the stand-by state for k seconds (Step S24). Then, to prepare for the measurement in relation to the second shot area, the effectiveness/ineffectiveness information with respect to the second shot area such as set forth below is compared with the preceding effectiveness/ineffectiveness information (Step S25):

| Second shot area |
|---|
| 101 ... Effective |
| 102 ... Effective |
| 103 ... Ineffective |
| 104 ... Effective |

For the second shot area, the nozzle 102 which has been ineffective newly comes effective, so that the condition set in Step S25 is satisfied. Therefore, the sequence proceeds to Step S27, whereby the measurement is effected by use of two air-sensor nozzles 101 and 104, without using the nozzle 102. On the basis of the information about such usableness and unusableness, Table 4 is prepared. Subsequently, the effectiveness/ineffectiveness information for the air-sensor nozzles with respect to the second shot area is stored into the working memory, by reference to Table 3 (Step S28). Then, the Z-axis focusing movement (Step S29) and the exposure (Step S291) are effected. After the exposure, the X-Y stage is moved to shift the wafer to the nextshot-area exposure position. The above-described operations are repeated until the last shot area (No. 32) is subjected to the exposure operation. By this, Table 4 is completed. Once Table 4 is completed, the wafers following the first wafer can be processed in accordance with Table 4.

In accordance with the present embodiment, as has hitherto been described, which one or ones of plural air-sensors are to be used is determined on the basis of the information about the layout of shot areas on the wafer. And, for the measurement after a fixed and constant delay time, such air-sensor or air-sensors that contribute to deterioration of the measurement accuracy are not used. So, the Z-axis focusing movement is made on the basis of the results of measurement by the remaining effective nozzles, only. Accordingly, high-accuracy focusing is attainable while retaining the throughput of the exposure apparatus including the focusing system of the present embodiment.

A third embodiment of the present invention will now be decribed.

Important features of the third embodiment may be summarized as follows:

(1) Appropriate delay times for respective shot areas are preparatorily set, such as set forth in Table 5, shown below:

TABLE 5

| SHIFT OF NOZZLE POSITION | DELAY TIME (SEC.) |
| --- | --- |
| FROM AN "OUT-OF-WAFER POSITION" TO AN "ON-WAFER POSITION" | k1 |
| FROM AN "ON-WAFER POSITION" TO ANOTHER "ON-WAFER POSITION" | k2 |

In this example, two kinds of delay times, k1 and k2 are set. The delay time k1 (sec.) corresponds to the stabilization time for the output voltage of one nozzle where it is relatively shifted from an "out-of-wafer position" to an "on-wafer position", whereas the delay time k2 (sec.) corresponds to the stabilization time for the output voltage of one nozzle where it is relatively shifted from an "on-wafer position" to another "on-wafer position".

(2) On the basis of the effectiveness/ineffectiveness information for the air-sensor nozzles, obtained by calculations in the console, an appropriate one of the delay times, corresponding to a particular shot area, is selected. And, after expiration of the selected delay time from the completion of movement of the X-Y stage, the outputs of the air-sensors are read.

Figure 14:
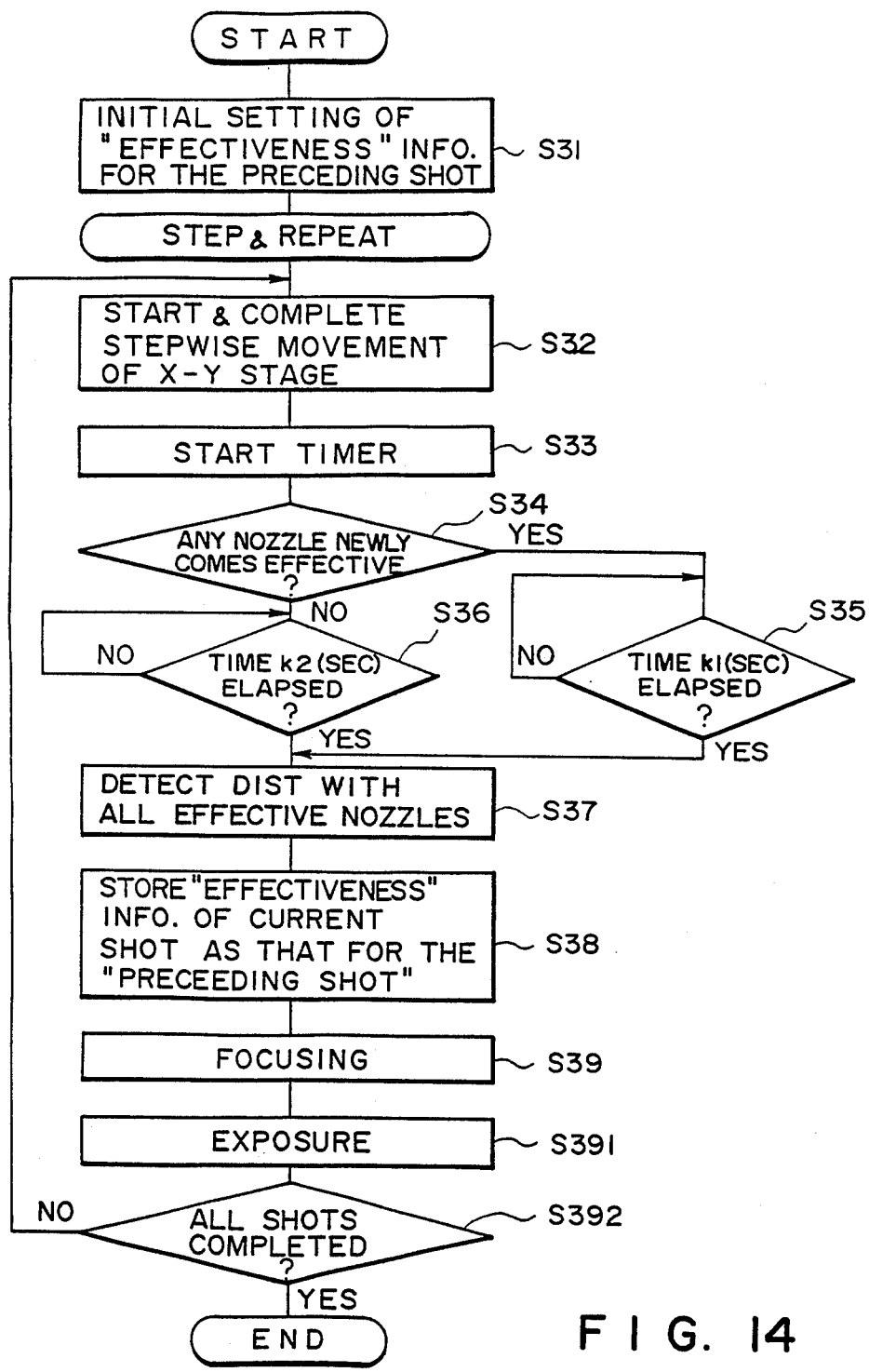

Referring now to a flow chart of FIG. 14, the operation of the third embodiment of the present invention will be described in detail.

First, at Step S31, the preceding effectiveness/ineffectiveness information for the air-sensor nozzles is initialized. In this example, by reference to a Table similar to that described in the foregoing, the effectiveness/ineffectiveness information for the first shot area is stored into a working memory as the preceding effectiveness/ineffectiveness information. Then, the step-and-repeat operation is initiated. First, the X-Y stage starts movement and, upon completion of movement (Step S32), a timer is started (Step S33). The timer is provided in order to measure the time period from the completion of movement of the X-Y stage to the point of initiation of measurement by the air-sensors. Subsequently, the effectiveness/ineffectiveness information for the nozzles with respect to the current shot area is compared with the stored preceding effectiveness ineffectiveness information, and discrimination is made whether or not there is any nozzle which newly comes effective (Step S34). If there is any one satisfying the condition set in Step S34, the sytem is held in a stand-by state until the expiration of the delay time k1 (Step S35). If no nozzle satisfies the condition set in Step S34, the system is held in the stand-by state until the expiration of the delay time k2 (Step S36). Then, the measurement is effected by use of all the effective nozzles (Step S37), and the current effectiveness/ineffectiveness information is stored into the working memory as the preceding effectiveness/ineffectiveness information (Step S38), while referring to the Table similar to that described in the foregoing. Then, an average of the results of measurement at Step S37 is calculated and, on the basis of the thus detected average, the Z-axis focusing movement is effected (Step S39). Finally, the exposure is effected (Step S391) and, the wafer stage is moved to shift the wafer to the next-shot-area exposure position.

Appropriate values for the two kinds of delay times k1 and k2 described in the foregoing can be determined by experiments. Usually, k1 is greater than k2.

Table 6 is similar to Table 4 and shows the effectiveness/ineffectiveness of the air-sensor nozzles with respect to each of thirty-two (32) shot areas defined on one wafer. Also, Table 7 shows the delay time k1 or k2 selected for each of the shot areas shown in Table 6.

TABLE 6

| SHOT NO. | 101 | 102 | 103 | 104 |
| --- | --- | --- | --- | --- |
| 1 | YES | NO | NO | YES |
| 2 | YES | YES | NO | YES |
| 3 | YES | YES | NO | YES |
| 4 | NO | YES | NO | YES |
| 5 | NO | YES | NO | YES |
| 6 | YES | YES | YES | YES |
| 7 | YES | YES | YES | YES |
| 8 | YES | YES | YES | YES |
| 9 | YES | YES | YES | YES |
| 10 | YES | NO | NO | YES |
| 11 | YES | NO | YES | YES |
| 12 | YES | YES | YES | YES |
| 13 | YES | YES | YES | YES |
| 14 | YES | YES | YES | YES |
| 15 | YES | YES | YES | YES |
| 16 | NO | YES | YES | YES |
| 17 | NO | YES | YES | YES |
| 18 | YES | YES | YES | YES |
| 19 | YES | YES | YES | YES |
| 20 | YES | YES | YES | YES |
| 21 | YES | YES | YES | YES |
| 22 | YES | NO | YES | YES |
| 23 | YES | NO | YES | NO |
| 24 | YES | YES | YES | YES |
| 25 | YES | YES | YES | YES |
| 26 | YES | YES | YES | YES |
| 27 | YES | YES | YES | YES |
| 28 | NO | YES | YES | NO |
| 29 | NO | YES | YES | NO |
| 30 | YES | YES | YES | NO |
| 31 | YES | YES | YES | NO |
| 32 | YES | NO | YES | NO |

TABLE 7

| SHOT NO. | DELAY TIME (SEC.) |
| --- | --- |
| 2, 6, 11, 12, 18, 24, 30 | k1 |
| THE OTHERS | k2 |

Referring now to Tables 6 and 7 and the flow chart of FIG. 14, the flow of sequential process for the first and second shot areas, for example, will be described in detail.

First, at Step S31, the information about the first shot area, such as set forth below and obtainable by reference to Table 6, is stored into the working memory as initial values of the preceding effectiveness/ineffectiveness information:

| First shot area |
| --- |
| 101 ... Effective |
| 102 ... Ineffective |
| 103 ... Ineffective |
| 104 ... Effective |

After completion of movement of the X-Y stage to the first-shot-area exposure position (Step S32), the timer is started (Step S33). Then, the effectiveness/ineffectiveness information for the first shot area is compared with the stored preceding effectiveness/ineffectiveness information (Step S34). Since, for the first shot area, no nozzle has newly comes effective, the condition set in Step S34 is not satisfied. Thus, the sequence proceeds to Step S36 so that, after elapse of time k2 (Step S36), the measurement is effected by use of all the effective air-sensors (Step S37). Then, the effectiveness/ineffectiveness information for the nozzles with respect to the first shot area is stored into the working memory as the peceding effectiveness/ineffectiveness information (Step S38). Thereafter, the Z-axis focusing movement (Step S39) and the exposure (Step S391) are effected in this order. After completion of the exposure of the first shot area, the X-Y stage is moved to the second-shot-area exposure position (Step S32), and the timer is started (Step S33). To process the second shot area, the effectiveness/ineffectiveness information for the second shot area, such as set forth below, is compared with the preceding effectiveness ineffectiveness information (Step S34):

| Second shot area |
| --- |
| 101 ... Effective |
| 102 ... Effective |
| 103 ... Ineffective |
| 104 ... Effective |

Since, for the second shot area, the sensor nozzle 102 has changed into effective, i.e. newly comes effective, the condition set in Step S34 is satisfied. Accordingly, the delay time k1 is selected and, after expiration of the time k1 (Step S35), the measurement is effected by use of all the effective air-sensor nozzles (Step S37). Then, the selection of the delay time k1 is stored to prepare Table 7. Next, by reference to Table 6, the effectiveness/ineffectiveness information of the air-sensor nozzles with respect to the second shot area is stored into the working memory as the preceding effectiveness/ineffectiveness information (Step S38). Then, the Z-axis focusing movement is effected (Step S39) and, upon completion of exposure (Step S391), the X-Y stage is moved to the next-shot-area exposure position. The above-described operations are repeated until the exposure of the shot area No. 32 is effected. Once Table 7 is completed, the wafers following the first wafer can be processed in accordance with the content of Table 7.

According to the present invention, as has hither to been described, an appropriate delay time is selected for the measurement, in accordance with the positional relation between the air-sensor nozzles and the wafer, and the outputs of the air-sensors are read after expiration of the selected delay time. This allows high-accuracy focusing while avoiding waste of time. Avoidance of waste of time effectively improves the throughput of the exposure apparatus including the focusing system of the present embodiment.

A fourth embodiment of the present invention will now be described.

Important features of the fourth embodiment may be summarized as follows:

(1) Prediction or approximation function is determined; and (2) The outputs of the air-sensor is sampled with a constant time interval and the detected values are introduced into the prediction function to calculate an "expected value".

FIG. 8 shows the structure of an air-sensor. In FIG. 8, a high-pressure air supplied from an air source is discharged from each of the nozzles 101, 102, 103 and 104. The back pressure thereof causes expansion/contraction of the diaphragm 15 thereby to change the output displacement y thereof. If the wafer 7 facing to the nozzle is displaced in the Z-direction, i.e., the direction perpendicular to the wafer surface, the resistance to the discharge of the air from the nozzle changes. With the change in resistance, the pressure in the air-sensor changes and, as a result, the output displacement y of the diaphragm 15 changes. If it is assumed that the temperature T and the volume V of the air within the air-sensor and its tubes are constant, the pressure p therewithin is in a relation with the mass m of the air and a gas constant R, such as follows:

$$pV = mRT$$

On the other hand, the minute pressure change p due to the minute displacement x of the wafer in the Z direction can be treated in the form of a linear model, where the discharge of air is considered in terms of change in the mass, and it can be written as follows:

$$dm/dt = K1 \cdot x - K2 \cdot p$$

where K1 and K2 are constants.

The output displacement of the diaphragm is in proportion to the change in pressure, so it can be written as follows:

$$y = K3 \cdot p$$

where K3 is a constant.

It follows from the foregoing that, between the input displacement x and the output displacement y, there is a linear differential equation such as follows:

$$dy/dt = K4 \cdot x(t) + K5 \cdot y(t)$$

where K4 and K5 are constants and t is a variable representing the time.

It is seen from the above that the prediction or approximation function y(t) can be given in the form of an exponential function such as follows:

$$y(t) = A + B \cdot \exp(-Ct)$$

wherein A, B and C are parameters.

By introducing actually detected or measured values into the above prediction function, the parameters A, B and C are determined. At this time, the "expected" value is given by:

$$\lim_{t \to \infty}(A + C \cdot \exp(-Ct)) = A$$

That is, the expected value is obtainable by calculating the value A from the results of measurement at three points. From numerals data, it is known that the parameter C is constant. Therefore, the value of C can be preparatorily determined as a constant which is peculiar to the air-microsensor. If, therefore, the timing for the sampling of the outputs from the air-microsensor is predetermined, any calculation of the exponential function is not necessary and, rather, the values of A and B are obtainable by solving simultaneous equations. This leads to reduction in time for calculation, because the necessity of calculating the exponential function is avoided. For example, where y(1) and y(2) are obtained as a result of measurement, the values of A and B can be obtained by solving the following simultaneous equations:

$$y(1) = A + B \cdot \exp(-C)$$

$$y(2) = A + B \cdot \exp(-2C)$$

wherein C is a constant.

Figure 15:
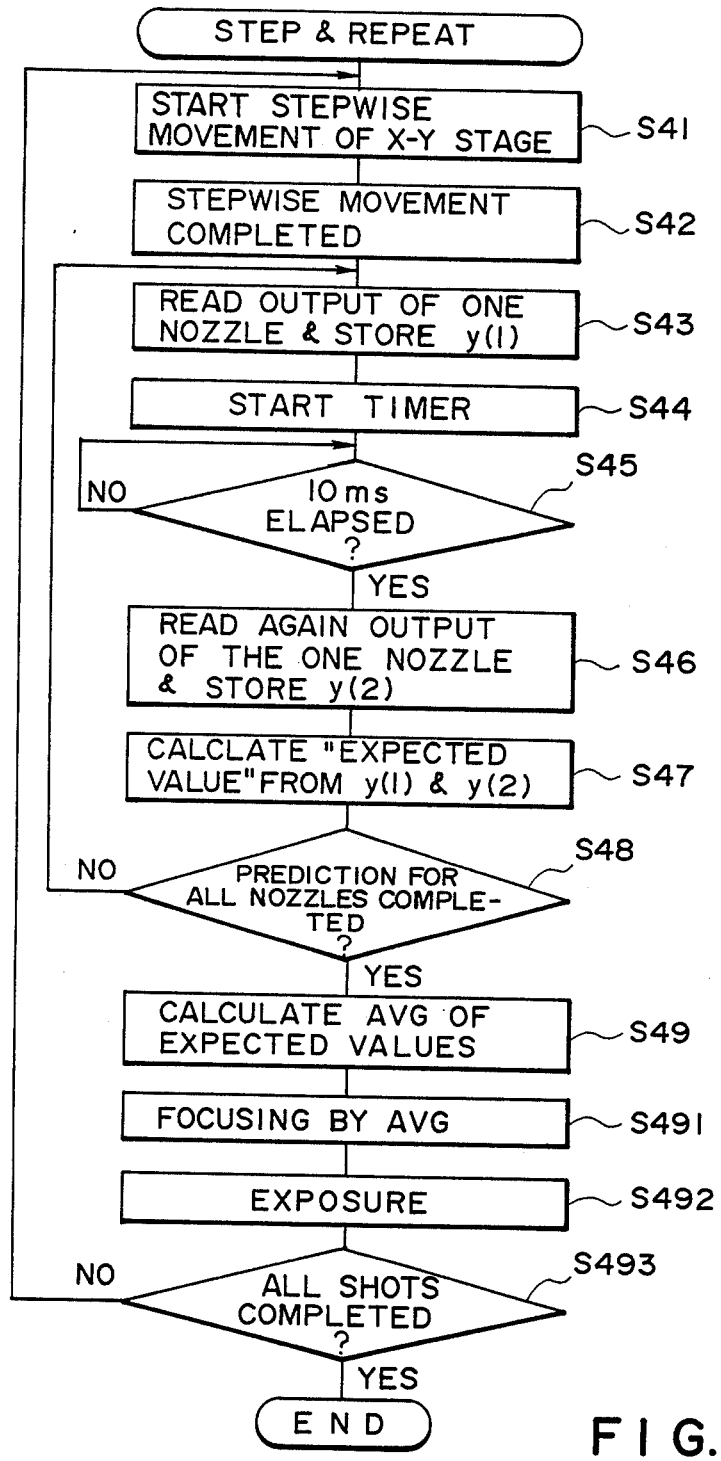

Referring now to a flow chart of FIG. 15, the operation of an automatic focusing device according to the present embodiment will be described in detail.

As the step-and-repeat operation is initiated, the X-Y stage is moved stepwise to the next-shot-area exposure position (Step S41). After completion of movement of the wafer stage (Step S42), a first measurement operation is effected by use of a particular air-sensor nozzle and the result of measurement, i.e. the output of the particular air-sensor, is stored into a memory as a detected value y(1), at Step S43. Then, a timer is started (Step S44) such that the system is held in a stand-by state for a constant and very short time period of an order of several microns to several tens of microns (Step S45). Upon expiration of the predetermined time period, a second measurement operation is effected by use of the aforesaid particular air-sensor nozzle, and the result of measurement is stored into the memory as a detected value y(2), at Step S46. By using the detected values y(1) and y(2), the simultaneous equations are solved, such that the expected value is calculated (Step S47). These operations are effected relative to each of the air-sensor nozzles. And, when all the calculations for detecting all the expected values with respect to all the nozzles are completed (Step S48), an average of the expected values is calculated (Step S49). Then, on the basis of the thus detected average, the Z-axis focusing movement is effected (Step S491) and exposure is effected (Step S492). The foregoing operations are repeatedly effected in the step-and-repeat manner until all the shot areas on one wafer are processed (Step S493). It has been confirmed that the time for calculation per one shot is approximately one-fifth of the fixed and constant delay time (k) described in the foregoing.

According to the present embodiment as has been described, the automatic focusing device is provided with processing means for calculating an expected value about the distance between a predetermined plane of a projection optical system and a surface of an object such as a wafer, on the basis of the result of measurement by the detecting means such as an air-sensor, whose output is not yet stabilized. With this arrangement, the output voltage of the air-sensor, after it is stabilized, can be detected by predicting calculations and in a very short time. And, this is attainable for each of the shot areas. As a result, high-speed focusing is assured while retaining satisfactory correctness.

A fifth embodiment of the present invention will now be described.

Important features of the fifth embodiment may be summarized as follows:

(1) With a predetermined constant time interval, the output voltage of the air-microsensor is repeatedly read by a predetermined number of times, and an average of them, i.e. a moving average is calculated. This is repeated and, each time one moving average is obtained, the difference between the precedingly-detected moving average (hereinafter "the preceding moving average") and the currently-detected moving average (hereinafter "the current moving average") is calculated. If the difference is reduced so that it comes within a certain reference range, it is discriminated that the air-microsensor is stabilized. So, the microprocessor which controls the measuring operation as a whole produces an instruction signal to read the output of the air-sensor at that time. Detecting the moving average of the output signals is to remove noise components of the signals and to detect only the inclination of the output signals.

(2) In addition to the discrimination on the difference between the preceding moving average and the current moving average, discrimination may be made as to whether the difference between the current moving average and each of actual values is within a predetermined tolerance or not. The words "actual values" mean the values of output voltages of the air-microsensor obtained by the sampling which has been made in order to obtain the moving average. By this additional discrimination, any periodic variation in the output voltage due to the existence of noise is detected, whereby a more accurate measurement is attainable.

Figure 16:
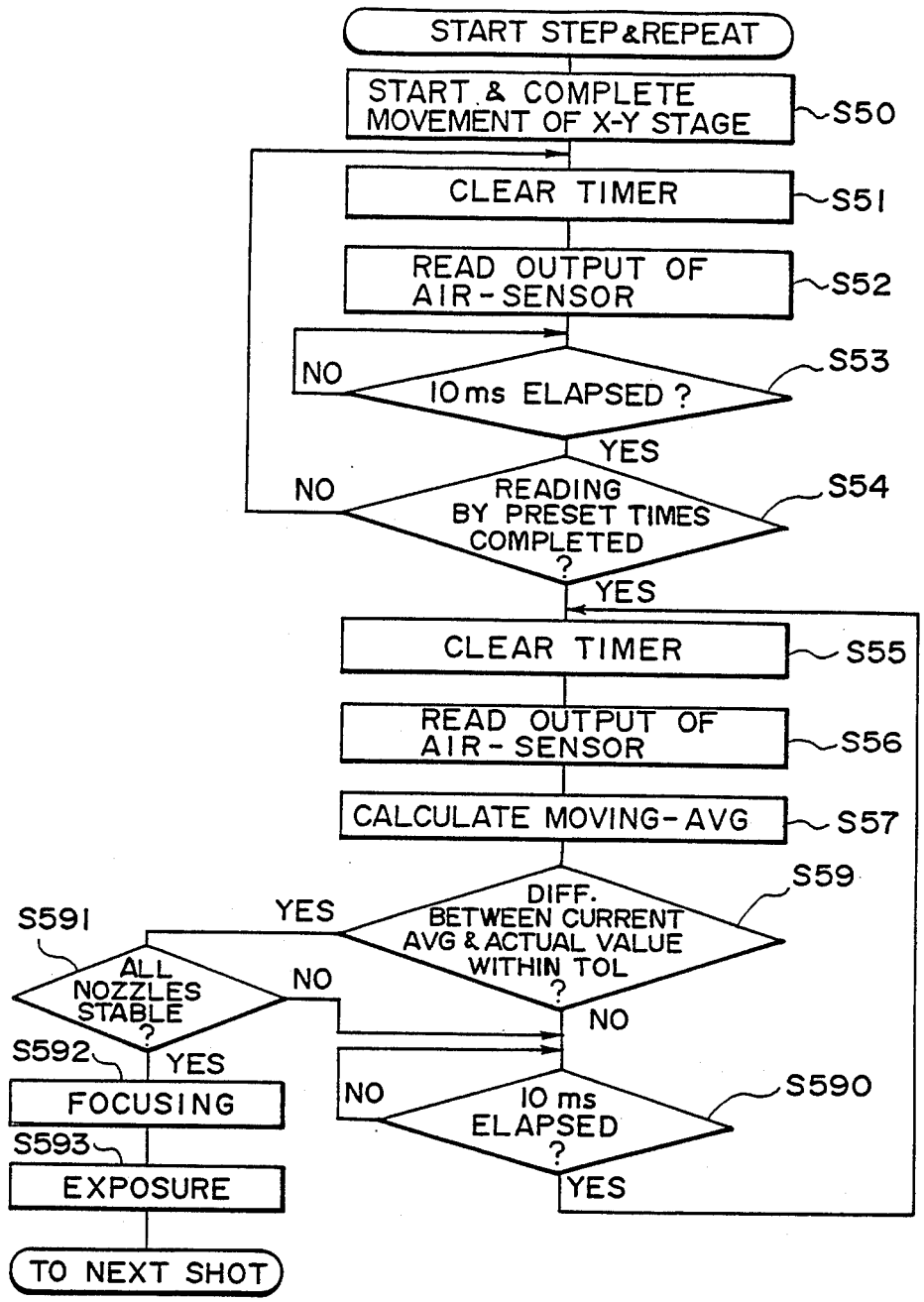

FIG. 16 is a flow chart showing the sequence of the operation in an automatic focusing device according to the fifth embodiment of the present invention. Referring now to the flow chart of FIG. 16, the present embodiment will be described in more detail.

After completion of movement of the X-Y stage to the next-shot-area exposure position (Step S50) the timer is cleared (Step S51) in order to intermittently read or detect the signal output of the air-sensor with a constant time interval of 10 ms, in this example. Then an output signal from the air-sensor is stored into the memory (Step S52). Then, the timer is examined and whether or not the time interval of 10 ms has elapsed is discriminated. If not, the system is still held in a stand-by state until the lapse of 10 ms (Step S53). Subsequently, whether or not a predetermined number (N) of output signals, for obtaining the moving average, have been read or detected is discriminated (Step S54). If not the timer is cleared again so as to effect again the reading of the outputs of the air-sensor. After the output signals of the predetermined number N are obtained for the sake of obtaining the moving average, the timer is cleared (Step S55) and the signal output of the air-sensor is detected again (Step S56). If the output signals of the number N are denoted by P1, P2, ..., PN, respectively, the moving average can be calculated in accordance with $(P1+P2+...+PN)/N$ (Step S57). Then, at Step S58, the difference between the preceding moving average and the current moving average is calculated, and whether or not the detected difference is within the predetermined tolerance is discriminated. If not within the tolerance, the system is held in a stand-by state for a time period of 10 ms, in this example (Step S590) and, thereafter, the signal output of the air-sensor is detected again (Steps S55 and S56). If, on the other hand, the tolerance is satisied at Step S58, the sequence goes to Step S591. When all the air-microsensor nozzles 101–104 come into the tolerable state (Step S591), the outputs of these air-sensor nozzles 101–104, i.e. the detected distances d1–d4 are taken up and an average distance $(d1+d2+d3+d4)/4$ to the wafer 7 surface is calculated. The displacement of the wafer stage for the sake of focusing is made in accordance with the result of calculation (Step S592). Thereafter, the exposure is effected (Step S593) and the X-Y stage is moved stepwise to the next-shot-area exposure position.

During the time period from time t11 to time t12 (see FIG. 12), the operations in a loop comprising Steps S55, S56, S57, S58 and S590 are repeated. At time t12, the condition set in Step S58 is satisfied, such that the sequence goes to Step S591. Also, in FIG. 10 case, during the time period from time t21 to time t22, the operations in the loop comprising the Steps S55, S56, S57, S58 and S590 are repeated. At time t22, the condition set in Step S58 is stisfied, such that the sequence goes to Step S591. It is to be noted that, depending on the tolerance set in Step S58, the time t12 and the time t22 are variable. In consideration thereof, the tolerance is suitably set so that the time t12 or t22 for the detection of stabilization, according to the present embodiment, becomes close to the time t13 or t23 of actual stabilization.

A modified form of the present embodiment will now be described in detail, taken in conjunction with a waveform view of FIG. 17 and a flow chart of FIG. 18.

Figure 17:
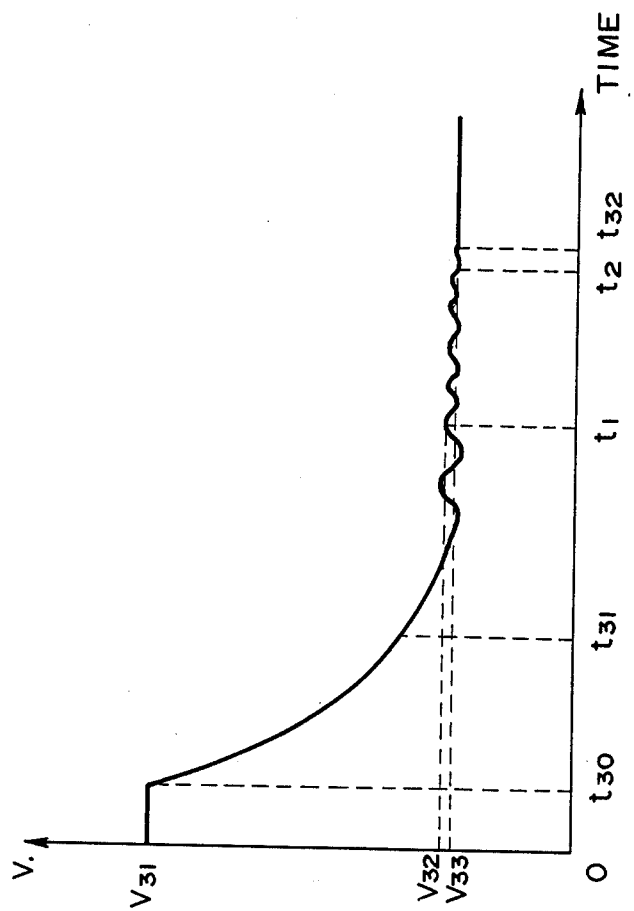
FIG. 17 is a view similar to FIG. 12, but showing another characteristic of the output voltage of the air-sensor, which may appear depending on conditions.
Figure 18:
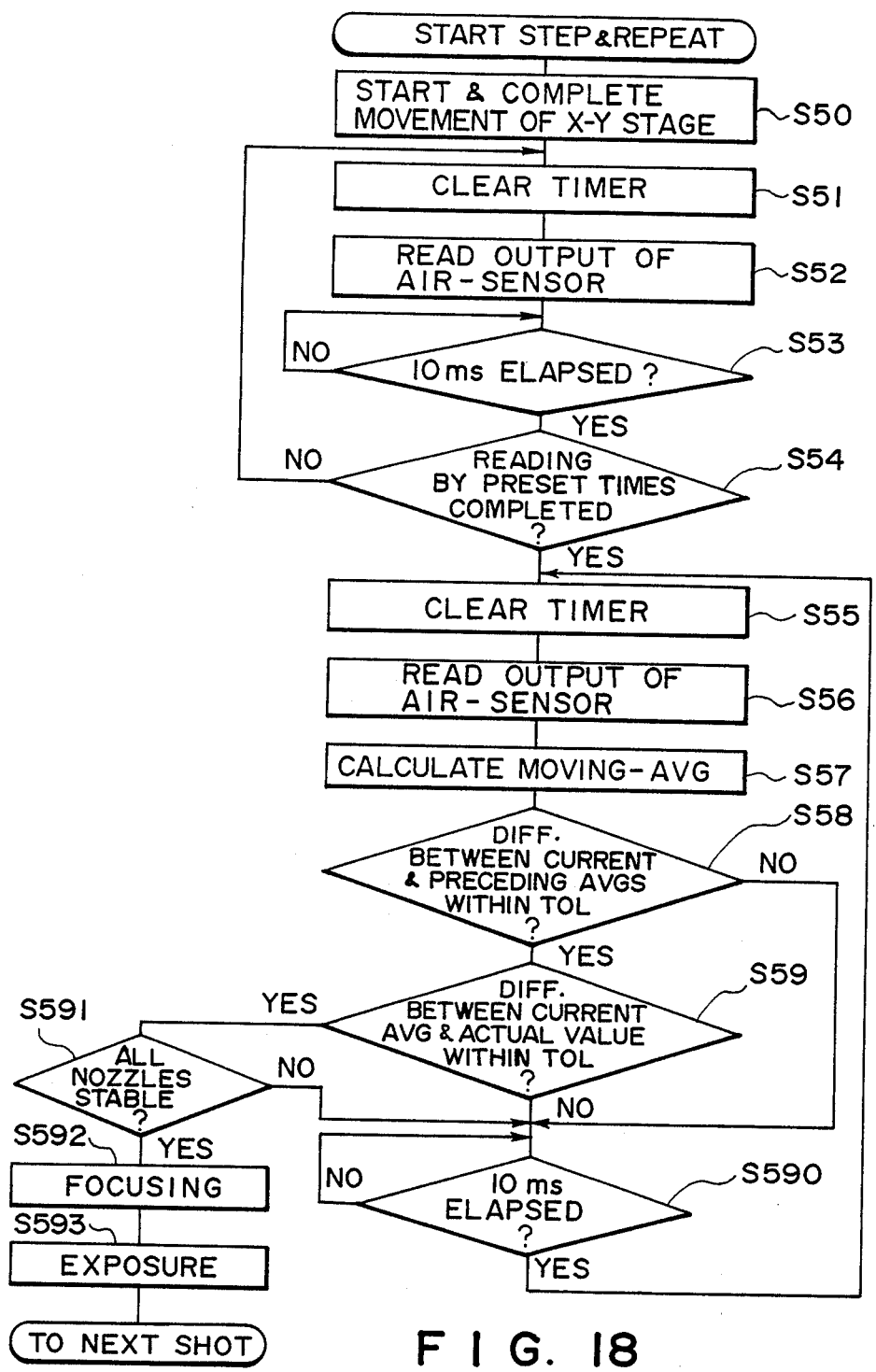
FIG. 18 is a flow chart showing the operation of an exposure apparatus including an automatic focusing device according to a further embodiment of the present invention.

FIG. 17 is a view similar to FIG. 12. What is different from FIG. 12 is that, in the waveform of FIG. 17, the output voltage of the air-microsensor includes periodic variation, i.e. noise. In many cases, vibration caused by movement of any component of the apparatus or excessive response of the diaphragm contributes to such noise. In FIG. 17, at time 0, the X-Y stage starts movement. The output voltage from the air-microsensor is V31. The air-microsensor starts response at time t30, and the movement of the X-Y stage is completed at time t31. As seen from this Figure, the level of the output signal from the air-microsensor is gradually decreased to a certain level and, after varying periodically, it enters into a stabilized state at time t32. The output voltage at time t32 is V33. It is now assumed that, at Step S58 shown in FIG. 16, the condition that the difference between the preceding moving average and the current moving average should be less than a predetermined level (tolerance) is satisfied at time t1, and that the output voltage of the air-microsensor at the same time is V32. If, such as the FIG. 17 case, the measurement made at the time t1 is based on the sampling for a peak portion of the periodically varying output signal, the result of measurement contains deviation from the correct value by an amount V32–V33. In other words, where a moving average is calculated from the results of measurement made to the output voltage containing periodic variation, such as the FIG. 17 case, it is possible that the periodic error is cancelled and, therefore, it is difficult to obtain correct values from the signal output such as shown in FIG. 17, only by the discrimination made at Step S58 (FIG. 16). In consideration thereof, according to the present modification, discrimination as to whether the difference between the current moving average and each of the actual values is within the predetermined tolerance or not is made in addition to the discrimination at Step S58. With this additional discrimination, any periodic variation in the output signal can be detected.

The sequence of the operation according to the present modification will now be described in detail, taken in conjunction with the flow chart of FIG. 18. The flow shown in FIG. 18 is similar to that of FIG. 16 but, in the flow of FIG. 18, Step S59 is added after Step S58 and before Step S590. Steps S50–S57 in FIG. 18 are the same as those in FIG. 16. At Step S58, as in the FIG. 16 embodiment, whether or not the difference between the preceding moving average and the current moving average is within the tolerance is discriminated. If not within the tolerance, the system is held in the stand-by state until the expiration of 10 ms and, thereafter, the output voltage of the air-microsensor is detected again (Step S590). If the condition set in Step S58 is satisfied, whether or not the difference between the current moving average and each of the actual values is within the predetermined tolerance is discriminated (Step S59). If not within the tolerance, the system is held in the stand-by state until the expiration of 10 ms and, thereafter, the output voltage of the air-microsensor is detected again. If the condition set in Step S59 is satisfied, it is confirmed that the output from the air-microsensor nozzle is stabilized. So, the sequence goes to Step S591.

During the time period from time t91 to time t1 (FIG. 7), the operations in a loop comprising Steps S55, S56, S57, S58 and S590 are repeated. At time t1, the condition set in Step S58 is satisfied. Then, during the time period from time t1 to time t2, the operations in a loop comprising Steps S55, S56, S57, S58, S59 and S590 are repeated. At time t2, the condition set in Step S59 is satisfied, such that the sequence goes to Step S591. It is to be noted that the time t2 is changeable depending on the tolerance set in Step S59. In consideration thereof, the tolerance is suitably set so that the time t2 for the detection of stabilization and defined by the addition of Step S57 becomes close to the time t32 of actual stabilization.

In accordance with the present embodiment and the modification thereof, as has been described, the point of transition to a stable state for the output of an air-microsensor, which point is variable depending on the positional relation between the air-sensor and the object being examined, is detected in a most preferable manner and, after it is detected, the output of the air-microsensor is read. Accordingly, the distance measurement of a satisfactorily high accuracy is stably attainable, while avoiding wasted time. The accuracy of measurement can be improved further, where a narrower tolerance is set for the discrimination on the stableness of the output of the air-microsensor. Avoidance of wasted time effectively improves the throughput of the exposure apparatus including the automatic focusing device according to the present embodiment.

Figure 19:
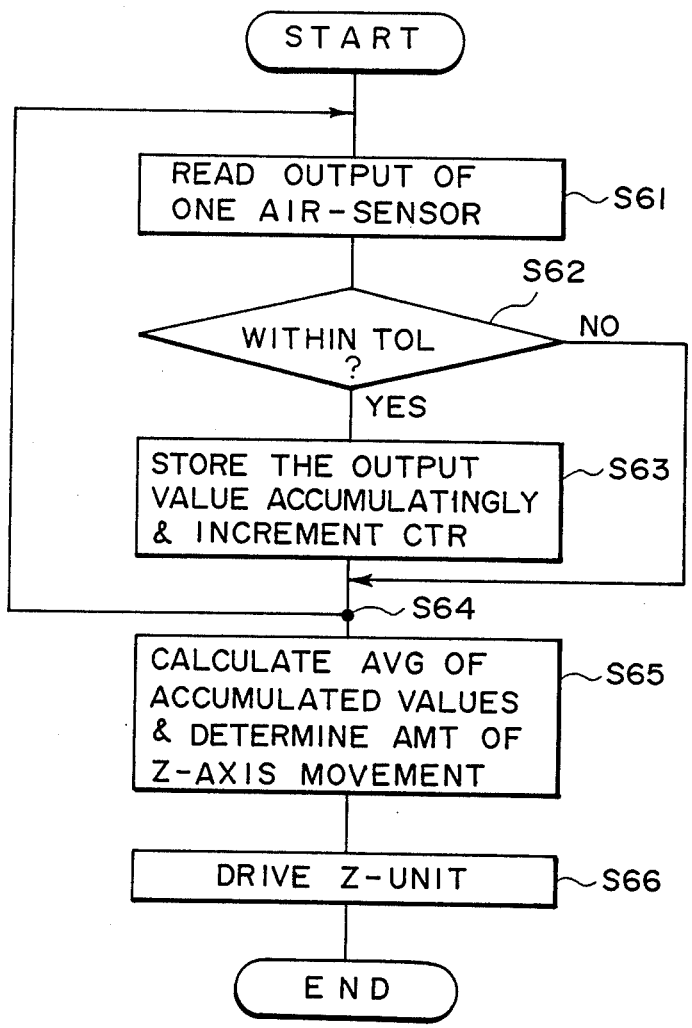
FIG. 19 is a flow chart showing a major portion of the operation of an automatic focusing device according to a still further embodiment of the present invention.

A sixth embodiment of the present invention will now be described, taken in conjunction with a flow chart of FIG. 19 showing a major portion of the operation thereof.

In the operation of the automatic focusing device according to the present embodiment, the output voltage of one of plural air-sensors is read or obtained (Step S61), and whether or not the detected value is, within a predetermined tolerance, that is whether or not the detected value is an extraordinary value, is discriminated at Step S62. If within the tolerance, the detected value is stored accumulatingly into a memory and, on the other hand, a counter (accept counter) for the admission of data is incremented by one (Step S63). If not within the tolerance, Step S63 is skipped. A similar operation is repeated with respect to each of the outputs of the remaining air-sensors (Step S64). After the discrimination as to the admission of the results of measurement for all the air-sensors is completed (Step S64), the sum of the accumulated values is divided by the number of output signals admitted, and an average is obtained. By the thus detected average, the amount of Z-axis movement is determined (Step S65) and the Z-unit is driven accordingly (Step S66). By this, the focusing is completed. The above-described tolerance set for the discrimination on the admission of the output of the air-sensor may be a fixed value or range. Or alternatively, it may be variably set by way of the console shown in FIG. 5. Also, the discrimination on the admission of the output of the air-sensor by comparing the output with a predetermined value or range can be replaced by:

(1) Setting, for the plural sensors, respective tolerances in consideration of the results of measurement which have been obtained from these sensors with respect to the preceding shot area, and comparing the outputs of the air-sensors for the current shot area with the thus determined tolerances, respectively.

(2) As a further alternative, the variation in the outputs of the air-sensors is calculated, and the amount of variation is compared with a predetermined reference.

According to the present embodiment, as has been described, the results of measurement for the distance between a projection optical system and a surface of a planar object, for the sake of automatic focusing, are accumulatingly stored immediately after they are obtained. This effectively improves the throughput of an exposure apparatus including the automatic focusing device of the present embodiment.

Figure 20:
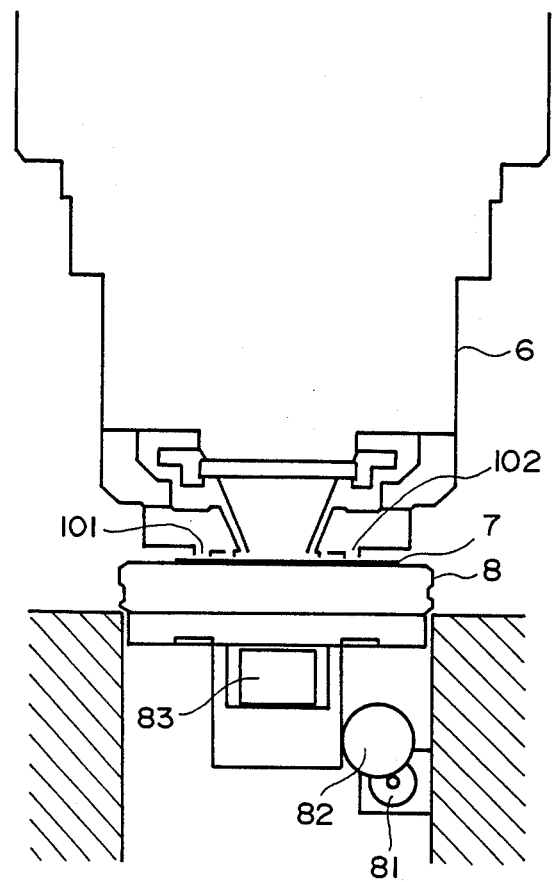
FIG. 20 is an enlarged and schematic view of a portion of the exposure apparatus shown in FIG. 1.

Referring now to FIG. 20, another aspect of the present invention will be described. FIG. 20 is an enlarged sectional view showing a major portion of the projection exposure apparatus of FIG. 1.

In FIG. 20, denoted by numeral 81 is a pulse motor; and by 82, is a drive transmitting mechanism for transmitting the drive from the pulse motor 81 to a Z-axis stage 8, while converting the rotational power of the pulse motor 81 into a Z-axis drive for the stage 8. Also, denoted by numeral 83 is a piezoelectric device. The pulse motor 81 is provided as a coarse driving system, while the piezoelectric device 83 is provided as a fine driving system. Each of the pulse motor 81 and the piezo-electric device 83 is effective to move the Z-stage 8 and the wafer 7 carried thereon in the direction of the optical axis of the projection lens system 6, i.e. in the Z-direction. The air-sensor nozzles 101 and 102 shown in FIG. 20 are located above the wafer 7 placed on the stage 8 and detect the distance between the projection lens system 6 and the wafer 7 surface. On the basis of the results of measurement, the amount of Z-axis movement (the amount of movement in the direction of the optical axis) is determined so as to bring the mask and the wafer into respective optical reference planes which are optically conjugate with each other with respect to the imaging optical system. The thus calculated amount of Z-axis movement is apportioned to the pulse motor 81 as the coarse driving system and the piezo-electric device 83 as the fine driving system. That is, the coarse and fine driving systems are actuated so as to move the Z-stage 8 by respective amounts.

Conventionally, the distance between the projection lens system and the surface of the wafer is measured once, and the Z-axis movement to adjust the position of the wafer relative to the projection lens system is made once. That is, only by one measuring operation and by one adjusting operation, the focusing is "completed". If, in such one Z-axis moving operation, the amount of necessary movement is greater than the maximum stroke of the fine driving system, the coarse driving system is actuated so as to supplement insufficiency of the stroke of the fine driving system. This means that the positioning accuracy of the driving system as a whole is determined by the driving accuracy of the coarse driving system which is lower than the accuracy of the fine driving system. This results in occurrence of positional errors due to mechanical back-lash or the like in the drive transmitting mechanism 82 of the coarse driving system or for any other reason. Consequently, high positioning accuracy of the driving system as a whole is difficult to achieve.

To obviate such problem, it may be necessary to measure again the distance to the wafer 7 surface by use of the air-sensors after completion of the Z-axis movement. It is known however that there is a time lag of an order of several tens of microseconds to several hundreds of microseconds in the response of the air-sensor. Such time lag in the response will lead to deterioration in the throughput of the exposure apparatus.

Such problem as described in the foregoing can be solved in accordance with one aspect of the present invention, which will now be described as a seventh embodiment.

Figure 21:
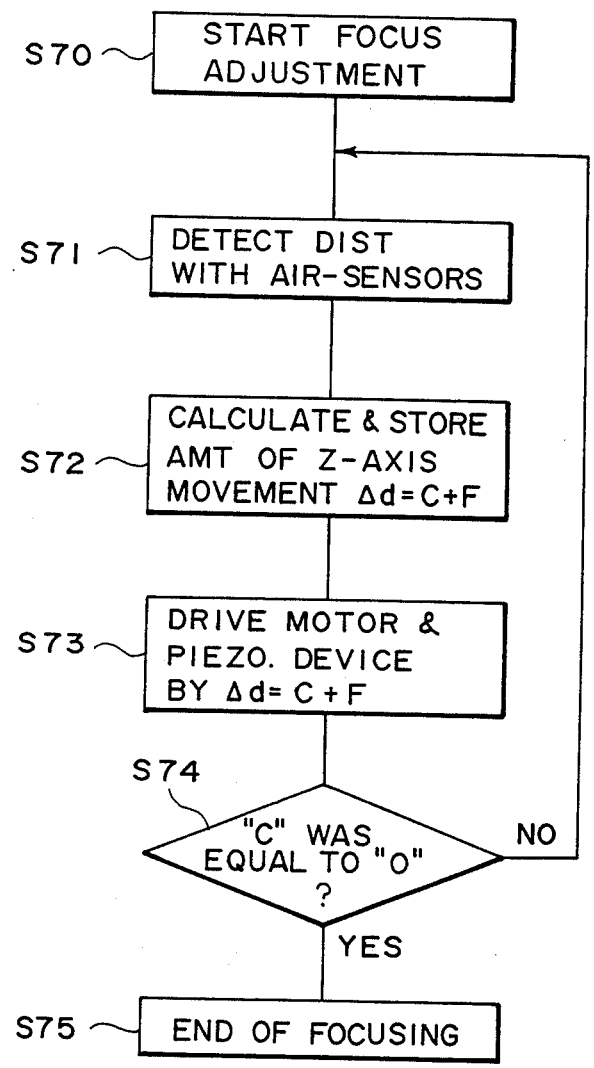
FIGS. 21 and 22 are flow charts showing, respectively, operations of automatic focusing device according to further embodiments of the present invention.

FIG. 21 is a flow chart showing a major portion of the operation of an automatic focusing device according to the seventh embodiment of the present invention. In FIG. 21, the focusing operation is initiated at Step S70. In response thereto, the distance to the wafer surface is measured by use of the air-sensors (Step S71). What is actually measured is the distance between the surface of the wafer 7 and the air-sensor nozzles 101–104. From the results of measurement, the necessary amount of Z-axis movement for the wafer 7, i.e. $\Delta d$, is determined by calculation. Then, the amount of Z-axis movement $\Delta d$ is apportioned, by calculation, to the pulse motor 81 and the piezo-electric device 83 so as to satisfy the following equation:

$$\Delta d = C + F$$

wherein C is the amount of movement to be made by the pulse motor 81 and F is the amount of movement to be made by the piezoelectric device 83. Also, the values C and F are stored into a memory (Step S72). In the apportionment, the value F is restricted by the maximum stroke of the piezoelectric device. In other words, the relation:

F < the maximum stroke of the piezoelectric device must be satisfied. After the apportionment, the Z stage is driven by the amount C assigned to the pulse motor 81 and by the amount F assigned to the piezoelectric device 83 (Step S73). Further, at Step S74, discrimination is made as to whether the value of C determined by calculation and stored into the memory, i.e. the amount of movement for the pulse motor as the coarse driving system, was zero or not. If it is discriminated that the amount C was not zero, the sequence goes back to Step S71 and the operations at Steps S71–S74 are repeated. Namely, the focusing operation is repeated. If, on the other hand, it is discriminated at Step S74 that the value C was zero, it means that the Z-axis movement last-effected at Step S73 has been made only by the piezoelectric device 83. In other words, in the preceding Step S73, the Z stage has been moved by an amount $\Delta d = F$ because C was equal to zero. And, at the time of Step S74, $\Delta d = 0$. Thus, it is discriminated that the wafer has been positioned very accurately because of the high positioning accuracy of the fine driving system. So, the focusing operation is completed (Step S75).

In this embodiment, as described, the completion of focusing is confirmed by discriminating whether or not the amount of movement by the pulse motor 81 as the coarse driving system was equal to zero. This leads to that the final positioning of the Z stage 8 is always achieved with the positioning accuracy of the pizeoelectric device 83 as the fine driving system. As a result, the Z-axis focusing movement which has conventionally been made with the lower accuracy determined by the coarse driving system can be made with the final positioning accuracy determined by the higher-accuracy fine driving system. Since high-accuracy positioning is assured, there is no necessity of measuring, again and after the Z-axis movement, the distance to the wafer surface by use of the air-sensors. As a result, deterioration of the throughput of the exposure apparatus, including the automatic focusing device, can be prevented.

It will be easily understood that substantially the same advantageous effects are attainable by use of a DC motor or a piezoelectric device having a longer stroke, in place of the pulse motor 81 shown in FIG. 20, or by use of a pulse motor or the like of the type having higher driving accuracy, in place of the piezoelectric device 83 shown in FIG. 20. Also, it will be easily understood that the discrimination at Step S74 in the flow chart of FIG. 21, which is made in this example by comparing the amount of drive C by the pulse motor 81 with "zero", may be made by comparing the amount of movement $\Delta d$ of the Z stage with the maximum stroke of the piezoelectric device. That is, the completion of the focusing may be confirmed by discriminating whether or not the following relation is satisfied:

$\Delta d \geq$ the maximum stroke of the piezo-electric device. Other modiciations is adoptable for the discrimination at Step S74.

According to the present embodiment, as has been described, discrimination is made as to whether the movement of an object being examined has made by use of a coarse driving system having a lower accuracy or the movement of the object has been made without such coarse driving system and by use of a fine driving system having higher accuracy, the discrimination being made on the basis of the information concerning the values obtained by the measurement for the distance to the surface of the object such as a wafer. And, in accordance with the result of discrimination, whether the focusing operation should be repeated or not is discriminated. This assures that the final stage of the focusing operation is always carried out only by the fine driving system having higher positioning accuracy. As a result, high positioning accuracy is consistently attainable.

Since high accuracy is assured upon completion of the Z-axis focusing movement, reexamination of the distance to the surface of the object after the Z-axis movement is not necessary. Therefore, degradation of the throughput of the exposure apparatus can be prevented.

Figure 22:
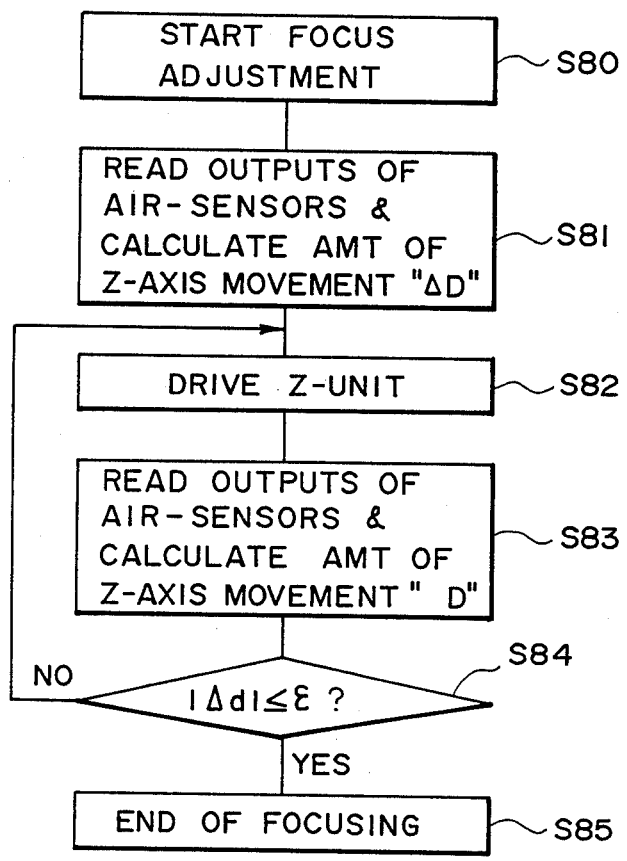

A eighth embodiment of the present invention will now be described, taken in conjunction with the flow chart of FIG. 22 showing a major portion of the operation of an automatic focusing device according to the present embodiment.

In response to initiation of the focusing operation (Step S80), the distance to the surface of the wafer is measured by use of air-sensors (Step S81). What is actually measured is the distance between the surface of the wafer 7 and the air-sensor nozzles 101–104. From the results of measurement, the amount of necessary movement $\Delta D$ of the wafer 7 in the Z direction is detected by calculation. The thus detected amount of movement $\Delta D$ is apportioned to the movement to be made by the pulse motor 81 and the movement to be made by the piezoelectric device 83. And, the Z-axis focusing movement is effected in accordance with the apportionment (Step S82). After the Z-axis movement, the distance to the wafer surface is measured again by use of the air-sensors, and the amount of necessary movement $\Delta d$ is calculated (Step S83). Further, an absolute value of $\Delta d$ is compared with a constant $\epsilon$ (Step S84). If $|\Delta d|$ is not greater than the constant $\epsilon$, the sequence goes to Step S85 so that the focusing operation is finished. If $|\Delta d|$ is greater than the constant $\epsilon$, the sequence goes back to Step S82 with the value $\Delta d$ being set as the necessary amount of Z-axis movement, and Steps S82–S84 are repeated. In other words, the focusing operation is repeated. Since the value $\epsilon$ directly determines the positioning accuracy, an appropriate value should be selected as $\epsilon$. As an alternative, the value $\epsilon$ may be input into the apparatus by handling the input key 12c. As a further alternative, the value $\epsilon$ may be preparatorily stored into the external memory 12e. It is a convenient alternative to arrange the system so that the value $\epsilon$ can be set and changed from the outside by an operator, because it allows the operator to change the positioning accuracy as desired.

In the present embodiment, the distance to the wafer surface is measured again each time the Z-axis movement is made, and the position of the wafer surface established by the movement is reexamined. Such remeasurement and resultant Z-axis movement are repeated until the position of the wafer surface comes into a predetermined tolerance. As a result, high accuracy focusing is stably consistently assured. A further improvement in the positioning accuracy is also attainable by setting a narrower tolerance.

According to the present embodiment, as has been described, an absolute value of the amount of necessary movement detected by calculation from the outputs of distance detecting means is compared with a predetermined value and, if the absolute value is not greater than the predetermined value, the focusing operation is completed. If it is greater than the predetermined value, the focusing operation is repeated. Thus, high positioning accuracy is stably attainable, regardless of the magnitude of the maximum driving stroke of the fine driving system.

Figure 23:
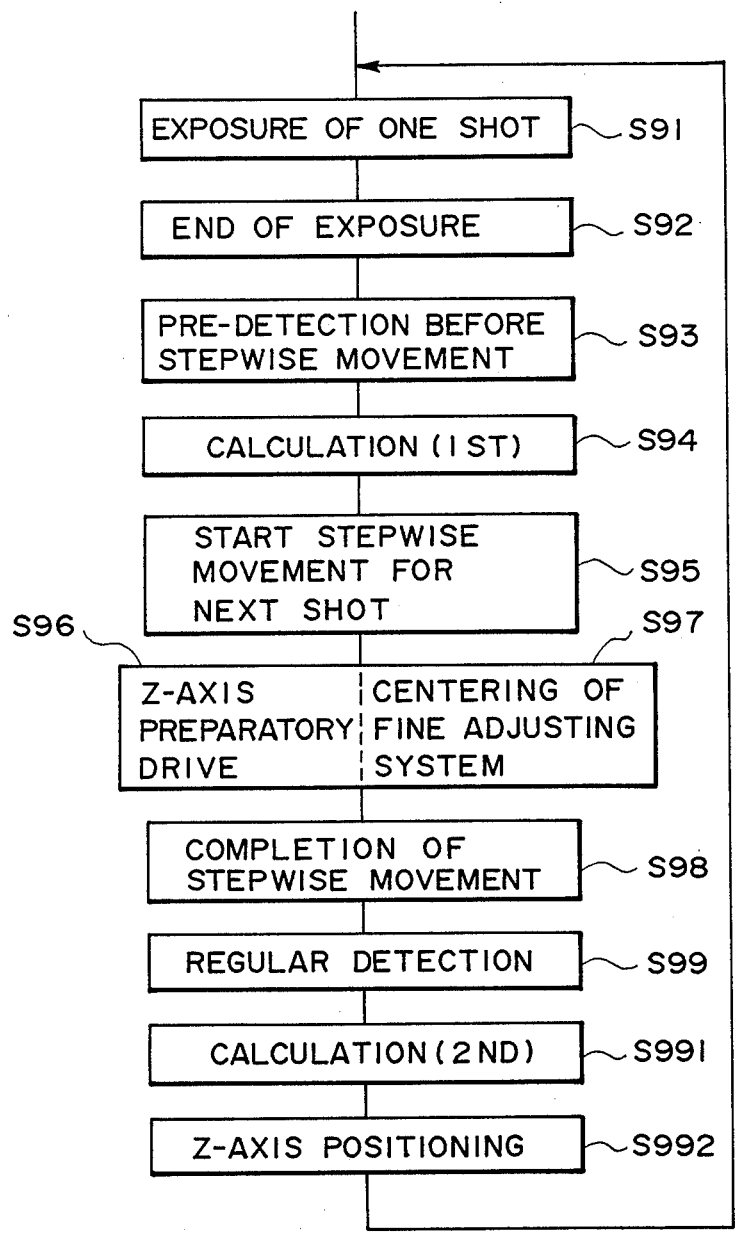
FIG. 23 is a flow chart showing a major portion of the operation of an exposure apparatus including an automatic focusing device according to a still further embodiment of the present invention.

A ninth embodiment of the present invention will now be described, taken in conjunction with a flow chart of FIG. 23 showing the operation of an exposure apparatus including an automatic focusing device according to the present embodiment.

In the flow chart of FIG. 23, one of shot areas on a wafer is being subjected to an exposure operation, at Step S91. Upon completion of the exposure (Step S92), pre-detection is effected before initiaion of the stepwise movement of the wafer stage to the next-shot-area exposure position. The pre-detection is made by use of one of air-sensor nozzles which is located at the position closest to the next shot area. By such pre-detection, an approximate value ΔD0 for the amount of necessary movement of the Z stage is obtained. Next, by a first calculation at Step S94, the amount of preparatory drive Δd0 to be made is calculated from the value ΔD0. The preparatory drive is one to move the Z stage during the stepwise movement of the wafer stage. More particularly, in the present embodiment, the Z stage is moved by the amount Δd0 during the stepwise movement of the wafer stage to the next-shot-area exposure position, so as to preparatorily set or bring the wafer stage to a position which is in the neighborhood of the middle of the driving range of the piezoelectric device 83, thereby to allow that only the drive of the piezoelectric device 83 is sufficient during regular Z-axis positioning (Step S992) which will be described later. The calculation for detecting the amount Δd0 from the value ΔD0 is made so as to satisfy the following relation, while paying consideration to a value ΔZ (which will be described later):

$|\Delta D0 - \Delta d0| \leq P/2$ wherein P is the resolution (the minimum drivable distance) of the pulse motor 81 as the coarse driving system. The amount of preparatory drive Δd0 corresponds to the amount of movement to be made by the coarse driving system only. Therefore, Δd0 is a value which is a multiple of P and which is closest to ΔD0. Where the preparatory drive of the amount Δd0 is actually to be made, driving pulses of a number P0 corresponding to the amount Δd0 are supplied to the pulse motor 81. It is seen from the foregoing that $|\Delta D0 - \Delta d0|$ as set forth above is the remainder of drive, which results from the driving only by the pulse motor 81. Namely, for the desired amount of drive ΔD0, the preparatory drive is actually made by an amount Δd0 which is closest to ΔD0, in consideration of the resolution of the pulse motor 81. Thus, the remainder is $|\Delta D0 - \Delta d0|$.

After initiation of stepwise movement of the wafer stage to the next-shot-area exposure position (Step S95), the Z-axis preparatory drive is effected at Step S96 by actuating the pulse motor 81 with the driving pulses of the aforementioned number P0. At the same time, the centering of the fine driving system is effected (Step S97), whereby the piezo-electric device 83 as the fine driving system is centered or brought to a position of the center of its driving range R. This centering is effected by displacing the piezoelectric device 83 by an amount ΔZ given by the following equation:

$\Delta Z = (R/2 - R0)$ wherein R0 is the current position of the piezoelectric device 83.

After completion of the stepwise movement to the next-shot-area exposure position (Step S98), regular detection or measurement is effected at Step S99 to detect the distance to the wafer 7 surface by use of the air-sensors 101–104, whereby accurate focusing information with respect to the aforesaid "next" shot area, which is now being placed under the projection lens system, is obtained. On the basis of this focusing information, the amount of necessary Z-axis movement Δd1 is calculated by a second calculation at Step S991. This amount Δd1 can be considered as being the sum of the above-described remainder $|\Delta D0 - \Delta d0|$ and any change in the position of the wafer surface due to the change in the shape of the wafer having been moved stepwise. Therefore, the amount Δd1 will be very minute and, in most cases, the following relation will be satisfied:

$|\Delta d1| < R/2$

The fine driving system has the driving range R, and the piezoelectric device 83 of the fine driving system has preparatorily been centered with respect to the center of that driving range, by the centering operation at Step S97. As a result, only by driving the piezo-electric device 83 by the amount Δd1, which is very minute, the focusing with respect to the "current" shot area (being positioned under the projection lens system) can be accomplished. The above-described operations at Steps S91–S992 are repeated for each of the remaining shot areas.

In the present embodiment, the system is arranged to effect preparatory drive by the coarse driving system and the centering of the fine driving system, prior to the regular detection or measurement for the distance to the wafer surface. This allows that the final positioning of the wafer relative to the projection lens system is always accomplished by the high-accuracy driving system, i.e. the fine driving system. As a result, high-accuracy focusing is consistently assured. Further, such initial setting of each of the coarse driving system and the fine driving system is effected during the time period for the step-feed of the wafer. So, the throughput of the apparatus as a whole is not degraded.

According to the present embodiment, as has been described, the automatic focusing device is provided with means for effecting preparatory drive by the coarse driving system and the initial setting of the fine driving system, prior to the measurement of the distance between a projection optical system and the surface of a planar object such as a wafer, the measurement being to be made before the processing of the object. To effect the initial setting of the fine driving system is very advantageous, because it allows most effective utilization of the driving range of the fine driving or adjusting system. Also, the feature that the final stage of focusing is always accomplished by the fine driving system having high positioning accuracy, stably assures high-accuracy focusing.

While the invention has been described with reference to the structures disclosed herein, it is not confined to the details set forth and this application is intended to cover such modifications or changes as many come within the purposes of the improvements or the scope of the following claims.

What is claimed is:

1. A distance calculating device, comprising:
   distance measuring means for measuring the difference between a surface of an object and a predetermined plane;

storing means having portions corresponding respectively to said distance measuring means, for storing information as to the effectiveness of each of measured distances by said distance measuring means, respectively, in accordance with points of measurement on the surface of the object; and means for calculating the distance between the surface of the object and the predetermined plane by reference to said storing means and by use of only an effective, distance, of said measured distances, in accordance with the points of measurement on the surface of the object.

2. A device according to claim 1, wherein said distance calculating device is adapted to focus an optical system.

3. A device according to claim 1, wherein said calculating means calculates an average of the values detected by the measurement by said distance measuring means.

4. A device according to claim 2, wherein the object comprises a wafer onto which a circuit pattern is to be transferred.

5. A distance calculating device, comprising:
distance measuring means for measuring the distance between a surface of an object and a predetermined plane; and discriminating means for discriminating, as effective, a value detected as a result of measurement by said distance measuring means whose point of measurement has been shifted relative to the object from a position on the surface of the object to another position on the surface of the object said discriminating means being operable to discriminate, as ineffective, a value detected as a result of measurement by said distance measuring means whose point of measurement has been shifted relative to the object from a position off the surface of the object to another position on the surface of the object.

6. A device according to claim 5, wherein said distance calculating device is adapted to focus an optical system.

7. A device according to claim 5, wherein the values detected and discriminated as effective are accumulated and an average is calculated, the average being used as the information about the distance between the surface of the object and the predetermined plane.

8. A device according to claim 5, wherein the object comprises a wafer onto which an integrated circuit is to be transferred.

9. An automatic focusing device, comprising:
means for moving a sheet-like object stepwise in a horizontal direction;

distance detecting means for measuring the distance between a predetermined plane of a projection optical system having an optical axis and the surface of the object and producing an output in response thereto;

driving means for moving one of the object and the projection optical system in a direction of the optical axis by an amount determined on the basis of information about the distance as calculated from values of outputs produced by said distance detecting means in accordance with the measurement; and means, operative upon calculation of the distance information after the stepwise movement, for determining which of the values of said outputs are to be used on the basis of information about a shot layout.

10. A distance calculation device, comprising:
means for measuring the distance between a surface of an object and a predetermined plane; and means for setting plural points of time for initiation of measurement of the distance by said measuring means, and for selecting one of the points of time for the measurement in accordance with a point of measurement defined on the surface of the object by said measuring means.

11. A device according to claim 10, wherein said distance calculating device is adapted to focus an optical system.

12. A device according to claim 10, wherein said apparatus includes a plurality of distance measuring means and wherein an average of distances measured by said plurality of distance measuring means is calculated, the average being used as information about the distance between the surface of the object and the predetermined plane.

13. A device according to claim 10, wherein the object comprises a wafer onto which an integrated circuit is to be transferred.

14. A distance calculating device, comprising:
means for measuring the distance between a surface of an object and the predetermined plane; and means for predicting the distance between the surface of the object and the predetermined plane on the basis of an output of said measuring means before the output from said measuring means becomes stable.

15. A device according to claim 14, wherein the prediction is made by detecting the output of said measuring means a plurality of times, before the output of said measuring means becomes stable.

16. A device according to claim 14, wherein the measurement of the distance by said measuring means is effected at plural points of measurement so that plural values are obtained by the prediction wherein an average of the predicted values is calculated, the average being used as information about the distance between the surface of the object and the predetermined plane.

17. A device according to claim 14, wherein said distance calculating device is adapted to focus of an optical system.

18. An automatic focusing device, comprising:
means for moving a sheet-like object stepwise in a horizontal direction;

distance detecting means for measuring the distance between a predetermined plane of a projection optical system having an optical axis and the surface of the object;

driving means for moving one of the object and the projection optical system in a direction of the optical axis by an amount determined on the basis of distance information from an output of said distance detecting means;

means for calculating an expected value about the distance information on the basis of plural values obtained from said distance detecting means before the output from said distance detecting means becomes stable.

19. A distance calculting method, comprising:
intermittently detecting the distance between a surface of an object and a predetermined plane with a predetermined time interval;

calculating a moving average from values obtained as a result of the intermittent detection of the distance;

repeating the intermittent detection and the calculation of the moving average at least once, and detecting a difference between the moving averages; and calculating, as the distance between the surface of the object and the predetermined plane, an average of the values obtained, by the intermittent detection, when the difference between the moving averages becomes not greater than a predetermined value.

20. A method according to claim 19, further comprising discriminating, after detection of the difference between the moving averages, whether a difference between the last-detected moving average and actual values obtained by sampling is not greater than a predetermined value.

21. A distance calculating method, comprising:
detecting the distance between a first region on a surface of an object and a predetermined plane;
comparing the value of the detected distance with a first predetermined value;
accumulating the detected value into storing means when the detected value is not greater than the first predetermined value, and incrementing a means for counting by a unit number, wherein the detected value is not accumulated into the storing means and the content of the counting means is retained as it is where the detected distance is greater than the first predetermined value;
detecting a second distance between the predetermined plane and a second region on the surface of the object;
accumulating the value of said second distance into said storing means when said value of said second distance is not greater than a second predetermined value different from the first predetermined value, and incrementing counting means by a unit member, wherein the detected value of said second distance is not accumulated into the storing means and the content of the counting means is maintained as it is where the value of said second distance is greater than the second predetermined value; and
dividing the content of the storing means by the content of the counting means, to calculate an average of the values stored into the storing means.

22. A distance measuring method, comprising:
measuring the distance between a surface of an object and a predetermined plane;
apportioning by calculation a value detected by the measurement to portions corresponding to an amount of coarse drive and an amount of fine drive, respectively, and moving stepwise the surface of the object and the predetermined plane relative to each other in accordance with the calculated amount of coarse drive and the calculated amount of fine drive; and
comparing the amount of coarse drive obtained by the calculation with a predetermined value, and stopping the measurement where the amount of coarse drive is equal to the predetermined value, but repeating the measurement and the calculation where the amount of coarse drive is not equal to the predetermined value.

23. A distance measuring method, comprising the steps of:

measuring the distance between a surface of an object and a predetermined plane;
detecting by calculation and storing an amount of relative movement to be made between the surface of the object and the predetermined plane, on the basis of a value obtained by the measurement of the distance;
moving the surface of the object and the predetermined plane relative to one another by an amount calculated and stored; and
comparing information on the amount of relative movement, stored, with a predetermined value, and discriminating whether the preceding steps are to be repeated in accordance with the result of comparison.

24. A method according to claim 23, wherein the information on the amount of movement, to be compared, is related to an amount of coarse movement to be made by coarse driving means.

25. A method according to claim 23, wherein the predetermined value includes a value of maximum stroke of a driving element for relatively moving the surface of the object and the predetermined plane.

26. An automatic focusing device, comprising:
means for moving a sheet-like object stepwise in a horizontal direction;
distance detecting means for measuring the distance between a predetermined plane of a projection optical system having an optical axis and a surface of the object; and
driving means for moving the object and the projection optical system relative to one another in a direction of the optical axis by an amount determined by information about the distance from an output of said distance detecting means;
wherein said driving means includes coarse driving means adatped to drive the object relative to the projection optical system in large increments, fine driving means adapted to move the object relative to the projection optical system in small increments as compared with the coarse driving means, and means for discriminating whether the focusing operation is to be repeated or to be finished, on the basis of information about the amount of movement by said coarse driving means.

27. A device according to claim 26, wherein said discriminating means discriminates the completion or repetition of the focusing operation in accordance with discrimination as to whether or not the amount of coarse movement is equal to zero.

28. A focusing method, comprising:
measuring the distance between a surface of an object and a predetermined plane for focusing;
moving the surface of an object and the predetermined plane relative to one another on the basis of the result of measurement;
re-measuring the distance between the surface of the object and the predetermined plane; and
repeating the relative movement and re-measurement where the result of re-measurement is greater than a predetermined value, wherein the focusing is finished where the result of re-measurement is not greater than the predetermined value.

29. A method according to claim 28, wherein the predetermined value is a tolerance set for the focusing.

30. An automatic focusing device, comprising:
means for moving a sheet-like object stepwise in a horizontal direction;

distance detecting means for measuring the distance between a predetermined plane of a projection optical system having an optical axis and a surface of the object;

driving means for moving the object and the projection optical system relative to one another in a direction of the optical axis by an amount determined by information about the distance from an output of said distance detecting means;

means for comparing an absolute value of said amount for the movement, with a predetermined value; and operation controlling means operative to close the focusing operation where the absolute value is not greater than the predetermined value and to repeat the relative movement and the measurement for the focusing where the absolute value is greater than the predetermined value.

31. A device according to claim 30, wherein the predetermined value is variably settable from outside.

32. An automatic focusing device, comprising:

means for moving a sheet-like object stepwise in a horizontal direction;

distance detecting means for measuring the distance between a predetermined plane of a projection optical system having an optical axis and a surface of the object; and driving means for moving the object and the projection optical system relative to one another in a direction of the optical axis by an amount determined by information about the distance from an output of said distance detecting means;

wherein said driving means includes coarse driving means adapted to move the object relative to the projection optical system in large increments, fine driving means adapted to move the object relative to the projection optical system in small increments as compared with said coarse driving means, and means for preparatorily driving said coarse driving means during stepwise movement and before the measurement of the distance by said distance detecting means.

33. An automatic focusing device, comprising:

means for moving a sheet-like object stepwise in a horizontal direction;

distance detecting means for measuring the distance between a predetermined plane of a projection optical system having an optical axis and a surface of the object; and driving means for moving the object and the projection optical system relative to one another in a direction of the optical axis by an amount determined by information about the distance from an output of said distance detecting means;

wherein said driving means includes coarse driving means adapted to move the object relative to the projection optical system in large increments, fine driving means adapted to move the object relative to the projection optical system in small increments as compared with said coarse means, and means for initially setting said fine driving means to a predetermined position during the stepwise movement and prior to the measurement of the distance by said distance detecting means.

34. An automatic focusing device, comprising:

means for moving stepwise a sheet-like object in a horizontal direction;

distance detecting means for measuring the distance between a predetermined plane of a projection optical system having an optical axis and a surface of the object; and driving means for relatively moving the object and the projection optical system in a direction of the optical axis by an amount determined by information about the distance as calculated from an output of said distance detecting means;

wherein said driving means includes coarse driving means adapted to move the object relative to the projection optical system, fine driving means adapted to move the object relative to the projection optical system finely as compared with said coarse driving means, and means operative to preparatorily drive said coarse driving means and to initially set said fine driving means to a predetermined position, during the stepwise movement and prior to the measurement of the distance by said distance detecting means.

* * * * *

UNITED STATES PATENT AND TRADEMARK OFFICE
CERTIFICATE OF CORRECTION

PATENT NO. : 4,714,331

DATED : December 22, 1987

INVENTOR(S) : KAZUYUKI ODA, ET AL.

Figure 13:
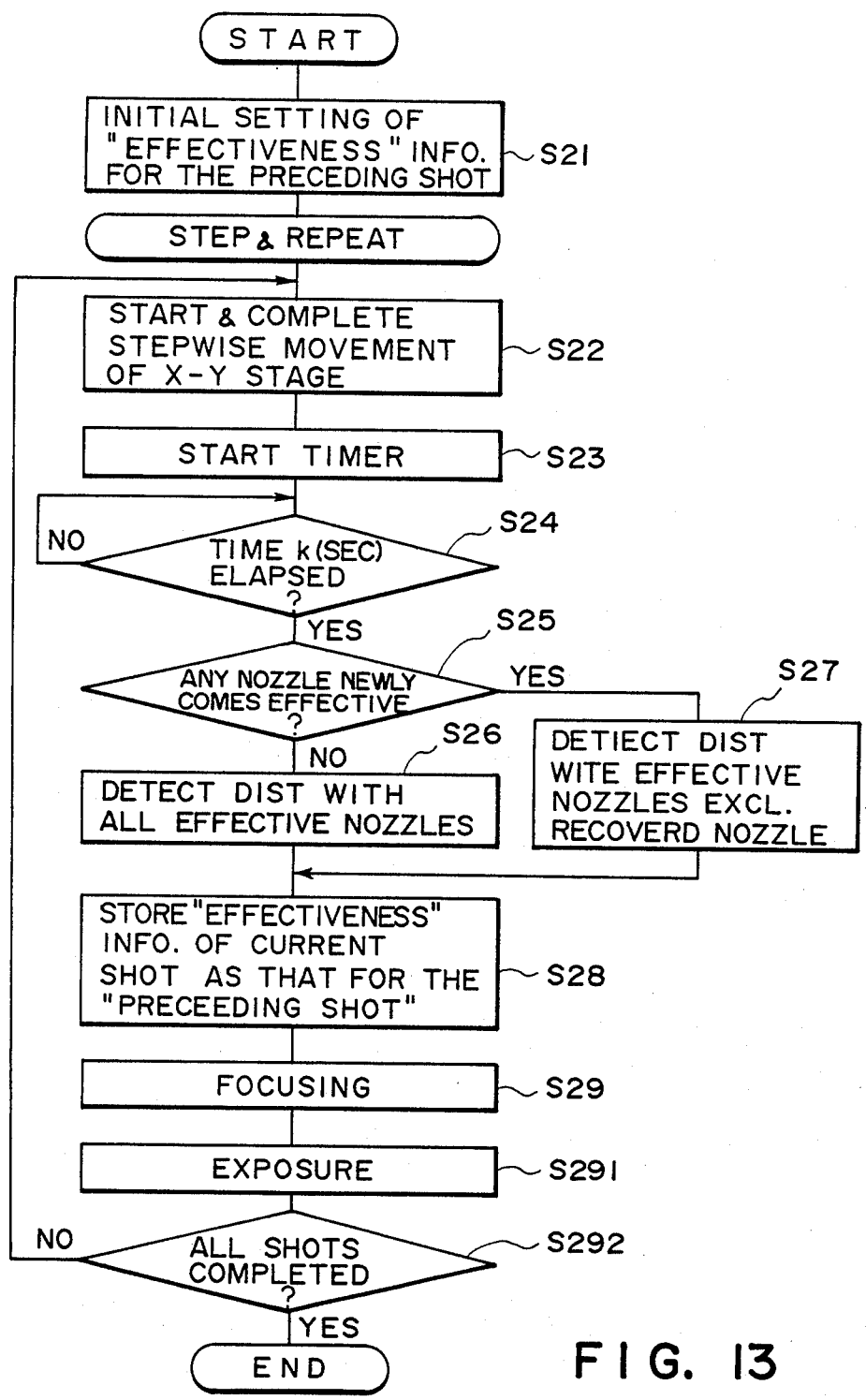
FIGS. 13–16 are flow charts showing, respectively, operations of exposure apparatuses including automatic focusing devices according to different embodiments of the present invention.

It is certified that error appears in the above-identified patent and that said Letters Patent is hereby corrected as shown below:

IN THE DRAWINGS:

Sheet 8, Figure 13, in block S27 "DETIECT" should read --DETECT--.
Sheet 8, Figure 13, in block S28, ""PRECEEDING SHOT"" should read --"PRECEDING SHOT"--.
Sheet 9, Figure 14, in block S38, ""PRECEEDING SHOT"" should read --"PRECEDING SHOT"--.
Sheet 10, Figure 15, in block S47, "CALCLATE" should read --CALCULATE--.

COLUMN 2

Line 20, "anoter" should read --another--.

COLUMN 3

Line 64, "wafer," should read --wafer--.

COLUMN 5

Line 53, "memory 12," should read --memory 12b,--.

COLUMN 7

Line 57, "an" should be deleted.

UNITED STATES PATENT AND TRADEMARK OFFICE
CERTIFICATE OF CORRECTION

PATENT NO. : 4,714,331
DATED : December 22, 1987
INVENTOR(S) : KAZUYUKI ODA, ET AL.

It is certified that error appears in the above-identified patent and that said Letters Patent is hereby corrected as shown below:

COLUMN 8

Line 27, "possile." should read --possible.--.

COLUMN 10

Line 43, "simimilar" should read --similar--.
    Lines 54-55, "unsableness" should read --unusableness--.
    Line 60, "unsable" should read --unusable--.
    Line 68, "anoter" should read --another--.

COLUMN 11

Line 5, "te" should read --the--.

COLUMN 13

Line 20, "decribed" should read --described--.

COLUMN 14

Lines 1-2, "effectiveness ineffectiveness" should read
        --effectiveness/ineffectiveness--.

UNITED STATES PATENT AND TRADEMARK OFFICE
CERTIFICATE OF CORRECTION

PATENT NO. : 4,714,331

DATED : December 22, 1987

INVENTOR(S) : KAZUYUKI ODA, ET AL.

It is certified that error appears in the above-identified patent and that said Letters Patent is hereby corrected as shown below:

COLUMN 15

Line 21, "comes" should read --become--.
Line 28, "peceding" should read --preceding--.
Line 37, "effectiveness ineffectiveness" should read --effectiveness/ineffectiveness--.
Line 66, "hither to" should read --hitherto--.

COLUMN 18

Line 60, "not" should read --not,--.

COLUMN 19

Line 10, "satisied" should read --satisfied--.
Line 29, "stisfied" should read --satisifed--.

COLUMN 23

Line 21, "that" should read --the situation that--.
Line 51, "modiciations is" should read --modifications are--.
Line 55, "made" should read --been made--.

COLUM 24

Line 7, "A" should read --An--.
Line 52, "stably" should be deleted.

UNITED STATES PATENT AND TRADEMARK OFFICE
CERTIFICATE OF CORRECTION

PATENT NO. : 4,714,331

DATED : December 22, 1987

INVENTOR(S) : KAZUYUKI ODA, ET AL.

It is certified that error appears in the above-identified patent and that said Letters Patent is hereby corrected as shown below:

COLUMN 25

Line 6, "initiaion" should read --initiation--.

COLUMN 26

Line 48, "being" should be deleted.

COLUMN 27

Line 10, "effective," should read --effective--.

COLUMN 28

Line 3, "calculation" should read --calculating--.
　　Line 46, "of" should be deleted.
　　Line 65, "calculting" should read --calculating--.

Signed and Sealed this

Nineteenth Day of July, 1988

Attest:

DONALD J. QUIGG

*Attesting Officer*　　　　　　　　　*Commissioner of Patents and Trademarks*